(12) United States Patent
Hashimoto et al.

(10) Patent No.: US 9,349,847 B2
(45) Date of Patent: May 24, 2016

(54) SEMICONDUCTOR DEVICE AND POWER CONVERTER

(75) Inventors: Takayuki Hashimoto, Tokyo (JP); Mutsuhiro Mori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/364,959

(22) PCT Filed: Dec. 15, 2011

(86) PCT No.: PCT/JP2011/078991
§ 371 (c)(1),
(2), (4) Date: Jun. 12, 2014

(87) PCT Pub. No.: WO2013/088544
PCT Pub. Date: Jun. 20, 2013

(65) Prior Publication Data
US 2014/0334212 A1    Nov. 13, 2014

(51) Int. Cl.
*H01L 29/66* (2006.01)
*H01L 21/332* (2006.01)
(Continued)

(52) U.S. Cl.
CPC ........ *H01L 29/7397* (2013.01); *H01L 27/0727* (2013.01); *H01L 29/0834* (2013.01);
(Continued)

(58) Field of Classification Search
USPC ........... 257/20, 194, 135–136, 213–413, 900, 257/902–903
See application file for complete search history.

(56) References Cited

U.S. PATENT DOCUMENTS

| 4,618,872 A | 10/1986 | Baliga |
| 4,743,952 A * | 5/1988 | Baliga ........................... 257/342 |

(Continued)

FOREIGN PATENT DOCUMENTS

| JP | 54-58378 A | 5/1979 |
| JP | 60-117673 A | 6/1985 |

(Continued)

OTHER PUBLICATIONS

Japanese Office Action dated Jan. 27, 2015 with English translation (eight pages).

(Continued)

*Primary Examiner* — Robert Bachner
*Assistant Examiner* — Moin Rahman
(74) *Attorney, Agent, or Firm* — Crowell & Moring LLP

(57) ABSTRACT

A semiconductor device of this invention (an IGBT with a built-in diode) includes: an $n^-$-type drift layer 1; a p-type channel region 2 that is arranged in contact with the surface side of this $n^-$-type drift layer 1; a gate electrode 5 that is provided in a trench T provided so as to penetrate this p-type channel region 2 and reach to the $n^-$-type drift layer 1 through a gate insulating film 3; an n-type source region 4 that is provided so as to contact the trench T on the surface side of the p-type channel region 2; a high-concentration n-type region 6 that is arranged in contact with the back side of the $n^-$-type drift layer 1; and a high-concentration p-type region 7 that is arranged in contact with the back side of this high-concentration n-type region 6; in which a junction of the high-concentration n-type region 6 and the high-concentration p-type region 7 is a tunnel junction. According to this semiconductor device, it is possible to form the IGBT and the diode on a single chip. Moreover, it is possible to avoid problems of "snap back" and "current concentration."

14 Claims, 17 Drawing Sheets

(51) Int. Cl.
- *H01L 29/739* (2006.01)
- *H01L 29/861* (2006.01)
- *H01L 29/08* (2006.01)
- *H01L 29/10* (2006.01)
- *H01L 27/07* (2006.01)
- *H01L 29/88* (2006.01)
- *H02M 7/537* (2006.01)

(52) U.S. Cl.
CPC ........ *H01L29/1095* (2013.01); *H01L 29/7395* (2013.01); *H01L 29/861* (2013.01); *H01L 29/88* (2013.01); *H02M 7/537* (2013.01)

(56) References Cited

U.S. PATENT DOCUMENTS

| | | | |
|---|---|---|---|
| 6,545,326 B2* | 4/2003 | Fukada et al. | 257/388 |
| 8,120,098 B2 | 2/2012 | Arai et al. | |
| 8,604,544 B2 | 12/2013 | Matsushita | |
| 2002/0117712 A1* | 8/2002 | Matsudai et al. | 257/330 |
| 2006/0131645 A1* | 6/2006 | Kaneko | 257/330 |
| 2007/0194346 A1* | 8/2007 | Nagase et al. | 257/146 |
| 2009/0283797 A1 | 11/2009 | Takahashi et al. | |

FOREIGN PATENT DOCUMENTS

| | | |
|---|---|---|
| JP | 60-191518 A | 9/1985 |
| JP | 62-109366 A | 5/1987 |
| JP | 2-206172 A | 8/1990 |
| JP | 7-297394 A | 11/1995 |
| JP | 2002-261282 A | 9/2002 |
| JP | 2006-173297 A | 6/2006 |
| JP | 2009-277792 A | 11/2009 |
| JP | 2010-45144 A | 2/2010 |
| JP | 2010-129697 A | 6/2010 |
| JP | 2011-204803 A | 10/2011 |

OTHER PUBLICATIONS

Ruething et al. "600 V Reverse Conducting (RC-) IGBT for Drives Applications in Ultra-Thin Wafer Technology" Proceedings of the 19th International Symposium on Power Semiconductor Devices & ICs, May 27-30, 2007, pp. 89-92, Jeju, Korea.

Rahimo et al. "A High Current 3300V Module Employing Reverse Conducting IGBTs Setting a New Benchmark in Output Power Capability" Proceedings of the 20th International Symposium on Power Semiconductor Devices & IC's, May 18-22, 2008, pp. 68-71, Oralando, FL.

International Search Report (PCT/ISA/210) dated Mar. 27, 2012 with English translation (5 pages).

Ruething et al. "600 V Reverse Conducting (RC-) IGBT for Drives Applications in Ultra-Thin Wafer Technology" Proceedings of the 19th International Symposium on Power Semiconductor Devices & ICs, May 27-30, 2007, pp. 89-92, Jeju, Korea.

Rahimo et al. "A High Current 3300V Module Employing Reverse Conducting IGBTs Setting a New Benchmark in Output Power Capability" Proceedings of the 20th International Symposium on Power Semiconductor Devices & IC's, May 18-22, 2008, pp. 68-71, Oralando, FL.

Watanabe et al. "1.7kV Trench IGBT with Deep and Separate Floating p-Layer Designed for Low Loss, Low EMI Noise, and High Reliability" Proceedings of the 23rd International Symposium on Power Semiconductor Devices & IC's, May 23-26, 2011, pp. 48-51, San Diego, CA.

Esaki "New Phenomenon in Narrow Germanium *p-n* Junctions" Letters to the Editor, Oct. 11, 1957, pp. 603-604, Tokyo, Japan.

Lu et al. "Retrograded Channel SOI LIGBTs with Enhanced Safe Operating Area" Proceedings of the 20th International Symposium on Power Semiconductor Devices & IC's, May 18-22, 2008, pp. 32-35, Oralando, FL.

Mori et al. "6.5kV Ultra Soft & Fast Recovery Diode (U-SFD) with High Reverse Recovery Capability" IEEE ISPSD'2000, May 22-25, 2000, pp. 115-118, Toulouse, France.

* cited by examiner

F I G . 1
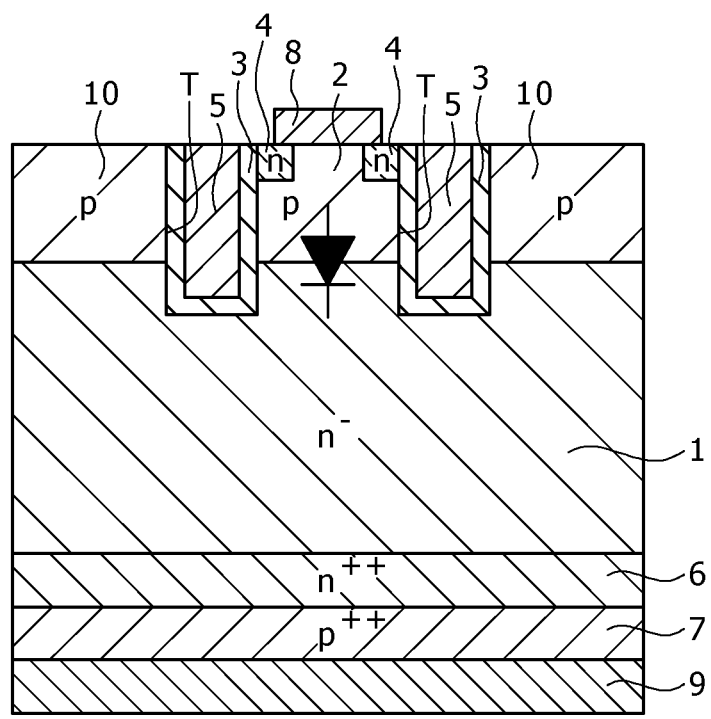

(A)

(B)

(A)

(B)

(A)

(B)

SEMICONDUCTOR DEVICE AND POWER CONVERTER

TECHNICAL FIELD

The present invention relates to a semiconductor device, and relates to a technology that is effective when being applied to a semiconductor device used in power converters for motor control, etc.

BACKGROUND ART

Many inverter circuits and converter circuits are being used for power converters ranging from small power apparatuses such as an air conditioner and a microwave oven to large power apparatuses used in railroad, an iron mill, etc. In such inverter circuits and converter circuits, as will be described later, an insulated gate bipolar transistor (IGBT) that is a kind of a power semiconductor, a diode, etc. are used.

For example, a below-mentioned Patent Literature 1 discloses a semiconductor device 1 in which an IGBT 101 and a PIN diode 102 are formed integrally. Moreover, below-mentioned Nonpatent Literatures 1 and 2 also disclose semiconductor devices each of which has the IGBT and the diode built in the same semiconductor substrate.

Incidentally, a below-mentioned Patent Literature 2 discloses an IGBT that has a collector electrode 500, a p-layer 100 that contacts the collector electrode 500 with a low resistance, an n-layer 112 that is lower in carrier concentration than the p-layer 100, and a drift n$^-$-layer 110 that is lower in carrier concentration than the n-layer 112. Moreover, a below-mentioned Nonpatent Literature 3 also discloses an IGBT that has a p-layer and an n-layer over a collector electrode.

Moreover, a below-mentioned Nonpatent Literature 4 discloses a p-n junction and a tunnel phenomenon of Ge; a below-mentioned Nonpatent Literature 5 discloses a vertical IGBT; and a below-mentioned Nonpatent Literature 6 discloses a technology of softening recovery of a diode element.

CITATION LIST

Patent Literature

Patent Literature 1: Japanese Unexamined Patent Application Publication No. 2010-129697
Patent Literature 2: Japanese Unexamined Patent Application Publication No. 2010-045144

Nonpatent Literature

Nonpatent Literature 1: H. Ruthing et al., "600-V Reverse Conducting (RC) IGBT for Drives Applications in Ultra-Thin Wafer Technology," Proc. IEEE ISPSD07, pp. 89-92, May 2007.
Nonpatent Literature 2: M. Rahimo et al., "A High Current 3300V Module Employing Reverse Conducting IGBTs Setting a New Benchmark in Output Power Capability," Proc. IEEE ISPSD08, pp. 68-71, May 2008.
Nonpatent Literature 3: S. Watanabe et al., "1.7 kV Trench IGBT with Deep and Separate Floating p-Layer Designed for Low Loss, Low EMI Noise, and High Reliability," Proc. IEEE ISPSD'11, pp. 48-51, May 2011.
Nonpatent Literature 4: L. Esaki, Phys. Rev. 109, pp. 603, 1958.
Nonpatent Literature 5: D. Lu et al., "Retrograded Channel SOI LIGBTs with Enhanced Safe Operating Area," Proc. IEEE ISPSD08, pp. 32-35, May 2008.
Nonpatent Literature 6: M. Mori et al., "6.5 kV Ultra Soft & Fast Recovery Diode (U-SFD) with High Reverse Recovery Capability," Proc. IEEE ISPSD00, pp. 115-118, May 2000.

SUMMARY OF INVENTION

Technical Problem

However, in device structures where the IGBT and the diode are formed integrally disclosed in the above-mentioned Patent Literature 1, Nonpatent Literatures 1 and 2, etc., as will be explained in detail later, "snap back" arises at the time of operation of the IGBT, which deteriorates its device characteristics. Moreover, at the time of diode operation, the current easily concentrates and its characteristic deteriorates such as an increase of a forward voltage drop of the diode.

Then, an object of the present invention is to provide a technology that can improve the characteristic of a semiconductor device. Specifically, the object is to provide a technology of improving a characteristic of the semiconductor device that contains the IGBT and the diode in the same semiconductor substrate.

The above-mentioned object, other objects, and new features of the present invention will become clear from a description and accompanying drawings of the specification of this application.

Solution to Problem

An outline of a typical invention among the inventions disclosed in this application will be briefly described as follows.

A semiconductor device shown in the typical example among the inventions disclosed in this application includes: a semiconductor layer of a first conductivity type; a first semiconductor region that is arranged in contact with the above-mentioned semiconductor layer on a first face side of the above-mentioned semiconductor layer and has a second conductivity type that is a conductivity type reverse to the first conductivity type; a gate electrode provided in a trench that is provided so as to penetrate the above-mentioned first semiconductor layer region and reach to the above-mentioned semiconductor layer through a gate insulating film; a second semiconductor region of the first conductivity type provided so as to contact the above-mentioned trench on the above-mentioned first face side of the above-mentioned first semiconductor region; a first high-concentration semiconductor region of the above-mentioned first conductivity type that is arranged in contact with a second surface side that is a side reverse to the above-mentioned first face side of the above-mentioned semiconductor layer; and a second high-concentration semiconductor region of the above-mentioned second conductivity type that is arranged in contact with the above-mentioned second face side of the above-mentioned first high-concentration semiconductor region, in which a junction of the above-mentioned first high-concentration semiconductor region and the above-mentioned second high-concentration semiconductor region is a tunnel junction.

A semiconductor device shown in the typical example among the inventions disclosed in this application includes: a semiconductor layer of the first conductivity type; a first semiconductor region that is arranged in contact with the above-mentioned semiconductor layer in a part on the first face side of the above-mentioned semiconductor layer and has a second conductivity type that is a conductivity type reverse to the first conductivity type; a second semiconductor region of the above-mentioned first conductivity type provided in contact with the above-mentioned first semiconductor region in a part on the above-mentioned first face side of the above-mentioned first semiconductor region; a gate electrode provided over the above-mentioned first semiconductor region though the gate insulating film; a first high-concentration semiconductor region of the above-mentioned first conductivity type that contacts the above-mentioned semiconductor layer in a part on the above-mentioned first face side of the above-mentioned semiconductor layer; a second high-concentration semiconductor region provided in contact with the first high-concentration semiconductor region in a part on the above-mentioned first face side of the above-mentioned first high-concentration semiconductor region, in which a junction of the above-mentioned first high-concentration semiconductor region and the above-mentioned second high-concentration semiconductor region is a tunnel junction.

A semiconductor device shown in the typical example among the inventions disclosed in this application includes: a semiconductor layer of the first conductivity type; a first semiconductor region that is arranged in contact with the above-mentioned semiconductor layer on a first face side of the above-mentioned semiconductor layer and has a second conductivity type that is a conductivity type reverse to the first conductivity type; a first high-concentration semiconductor region of the first conductivity type that is arranged in contact with the second face side of the above-mentioned semiconductor layer that is a side reverse to the above-mentioned first face side; and a second high-concentration semiconductor region of the second conductivity type that is arranged in contact with the above-mentioned second face side of the above-mentioned first high-concentration semiconductor region, in which a junction of the above-mentioned first high-concentration semiconductor region and the above-mentioned second high-concentration semiconductor region is a tunnel junction.

As the above-mentioned IGBT and the above-mentioned diode of a power converter that has parallel circuits in each of which the above-mentioned the IGBT and the above-mentioned diode are coupled together in parallel with their forward directions arranged in reverse directions, or as the above-mentioned diode, the above-mentioned semiconductor device can be incorporated thereinto.

The above-mentioned power converter (power conversion apparatus) includes: for example, a pair of direct current terminals; alternating current terminals whose number is equal to the number of phases of the alternating current; and power conversion units whose number is equal to the number of phases of the alternating current and each of which is comprised of two serially-coupled parallel circuits, each parallel circuit being comprised of a switching element and a diode of a reverse polarity, and is coupled between the above-mentioned pair of direct current terminals with a mutual coupling point of the parallel circuits coupled to a different alternating current terminals.

Advantageous Effects of Invention

According to the semiconductor device shown in the typical example illustrated below among inventions disclosed in this application, it is possible to improve the characteristic of the semiconductor device.

BRIEF DESCRIPTION OF DRAWINGS

FIG. 1 is a principal part sectional view showing a semiconductor device of an example 1.

DESCRIPTION OF EMBODIMENTS

Figure 2:
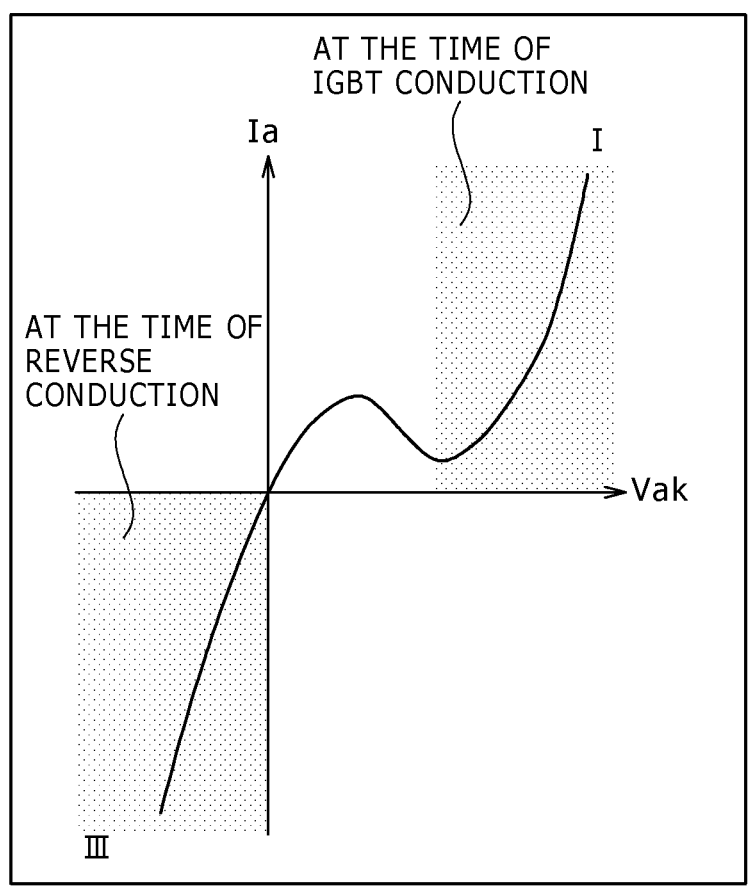
FIG. 2 is a diagram showing an output characteristic of a diode comprised of a high-concentration p-n junction.

In the following examples, when there is a necessity for convenience, they are divided into multiple sections or examples, and explanations are given to them. However, they are not mutually unrelated, and one section or example is in a relationship of a modification, an application example, a detailed explanation, a supplementary explanation, etc. of a part or the whole of the other section or example, except for the case where it is specifically indicated. Moreover, in the following examples, when referring to the number, etc. of a component (including the number of component, a numerical value, a quantity, a range, etc.), the example is not restricted to that specific number, and the number may be more than or less than the specific number except for the case where it is specifically indicated and the case where it is clearly limited to the specific number.

Furthermore, in the following examples, a component (including an element step, etc.) is not necessarily indispensable except for the case where it is specifically indicated and the case where it is considered clearly indispensable theoretically. Similarly, in the following examples, when referring to a shape, a positional relationship, etc. of the component, etc., it shall include one that is virtually approximate or similar to its shape, etc. except for the case where it is specifically indicated and the case where it is considered clearly not so theoretically. This is the same also about the above-mentioned number, etc. (including the number of components, a numerical value, a quantity, a range, etc.).

Hereinafter, examples of the present invention will be described in detail based on drawings. Incidentally, in all the diagrams for explaining the examples, the same or a related symbol is given to a component having the same function, and its repeated explanation is omitted. Moreover, in the below-mentioned examples, an explanation of the same or similar portion is not repeated in principle except for the case where it is specially required.

Moreover, in the drawings used in the examples, even in the case of a sectional view, hatching may also be omitted in order to make the drawing easy to see. Moreover, even in the case of a plan view, hatching may also be added in order to make the drawing easy to see.

Example 1

Hereinafter, a configuration and a manufacturing method of a semiconductor device of this example will explained in detail referring to drawings.

[Structure Explanation]

FIG. 1 is a principal part sectional view showing the semiconductor device of this example. The semiconductor device of this example has an IGBT (an IGBT part) and a diode (a diode part, a high-concentration p-n junction part). This particular semiconductor device can be said to be an IGBT (a reverse conduction IGBT) with a built-in diode. This IGBT is of a structure that is a so-called "trench gate type." The IGBT is a kind of a power MISFET, includes one that is a so-called vertical type and one that is a so-called horizontal type, and is classified into structures such as a "trench gate type" and a "planar gate type" according to structures of gate electrode parts. The IGBT of this example is the so-called vertical MISFET and is of a structure called the "trench gate type."

As shown in FIG. 1, the IGBT is arranged over a surface (a first face, an upper surface) side of a substrate (an $n^-$-type drift layer 1). This IGBT has the $n^-$-type drift layer 1 serving as a drain region, an n-type source region (an n-type semiconductor region, an emitter region) 4 serving as a source region, a p-type channel region (a p-type semiconductor region) 2 that is located between them and serves as a channel region, a gate insulating film 3 in contact with this p-type channel region 2, and a gate electrode 5 arranged over the p-type channel region 2 through the gate insulating film 3. These gate insulating film 3 and gate electrode 5 are arranged in a trench T. Moreover, describing it in another way, the IGBT has the $n^-$-type drift layer 1, the p-type channel region 2 arranged in contact with this first face side, the gate electrode 5 provided in the trench T that is provided so as to penetrate the p-type channel region and reach to the $n^-$-type drift layer 1 though the gate insulating film 3, and an n-type source region 4 provided so as to contact the trench on the first face side of the p-type channel region 2.

The diode is arranged on the back (a second face, an undersurface) side of the substrate (the $n^-$-type drift layer 1). This diode has a high-concentration n-type region 6 and a high-concentration p-type region 7. The high-concentration n-type region 6 is arranged in contact with the backside of the $n^-$-type drift layer 1; the high-concentration p-type region 7 is arranged on the back side of this high-concentration n-type region 6. In other words, the high-concentration p-type region 7 is arranged in contact with the back side of the high-concentration n-type region 6. A junction of these high-concentration n-type region 6 and high-concentration p-type region 7 is a tunnel junction as will be described later.

Moreover, an emitter electrode 8 electrically coupled with the n-type source region 4 is arranged on the surface side of the substrate (the $n^-$-type drift layer 1); a collector electrode 9 is arranged on the high-concentration p-type region 7 on the back side of the substrate (the $n^-$-type drift layer 1).

Incidentally, in the figures and in this specification, "−" after n or p indicates that the impurity concentration is low, and "+" indicates that the impurity concentration is high. Moreover, when there is no indication of "−" or "+" after n or p, it indicates that the impurity concentration is higher than "−," and the impurity concentration is lower than "+." Furthermore, "++" indicates that the impurity concentration is higher than "+."

Therefore, the high-concentration n-type region 6 is higher in n-type impurity concentration than, for example, the n-type source region 4, and the high-concentration p-type region 7 is higher in p-type impurity concentration than, for example, the p-type channel region 2. The impurity concentration thereof are more than or equal to $1 \times 10^{19}$ cm$^{-3}$ in an interface of the p-n junction part. Here, examination of the inventors has revealed that when the impurity concentration becomes high, for example, exceeding $3 \times 10^{20}$ cm$^{-3}$, an ON voltage at the time of IGBT conduction (at the time of ON) becomes high as will be described later. Therefore, it is desirable that the impurity concentration of the high-concentration n-type region 6 be less than or equal to $3 \times 10^{20}$ cm$^{-3}$.

Thus, according to this example, since the IGBT and the diode are complexly incorporated into the same substrate, it is possible to attain multi-functionalization of the semiconductor device. Specifically, it is possible to configure both the IGBT and the diode coupled to this IGBT in reverse parallel in a single chip [effect 1].

Figure 21:
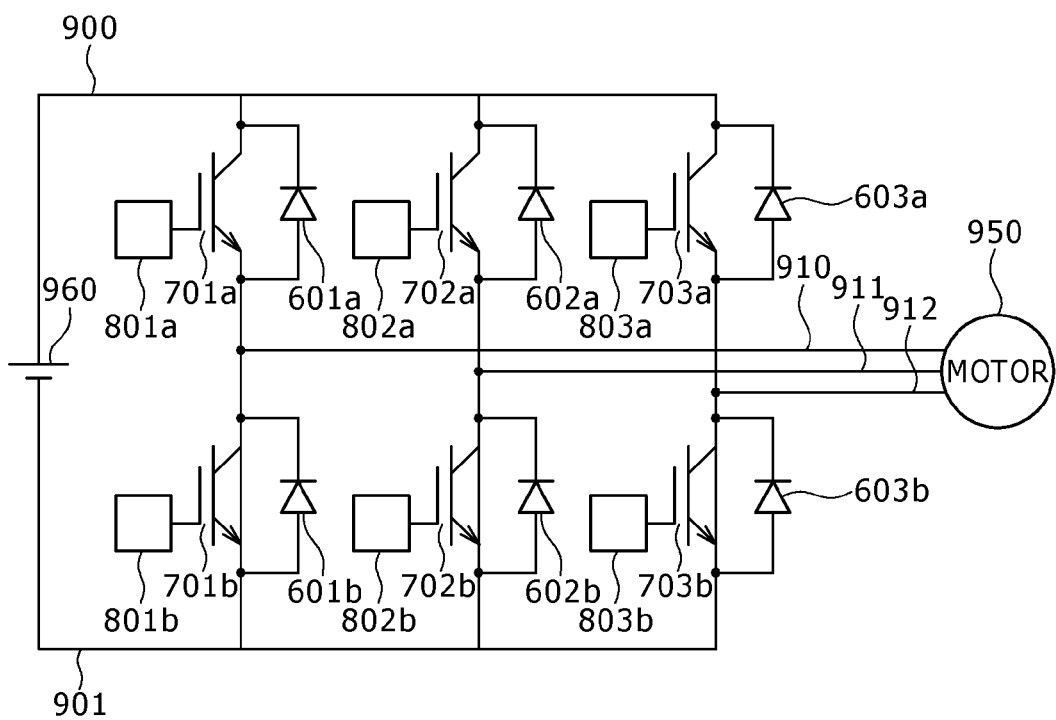
FIG. 21 is a diagram showing a circuit diagram of a three-phase motor.

It is suitable that such a chip (the IGBT and diode) is used for a circuit (an inverter circuit, a power converter circuit) that will be explained in detail in the example 9 (FIG. 21). In the circuit shown in FIG. 21, flywheel diodes 601a to 603a and 601b to 603b are associated with the above-mentioned diode, and IGBTs 701a to 703a and 701b to 703b are associated with the above-mentioned IGBT.

The flywheel diode 601b is coupled to the IGBT 701b in reverse parallel to the IGBT 701b. The flywheel diode 601b releases energy collected in the coil of a motor 950, for example, when the IGBT 701a turns OFF by commutating a current flowing in the IGBT 701a to the flywheel diode 601b in reverse parallel to the IGBT 701b (the IGBT over a lower arm) whose emitter is coupled to a power supply terminal 901 on the negative side.

When the IGBT 701a over an upper arm is turned on again, the flywheel diode 601b over the lower arm becomes non-conductive state, and electric power is supplied to the motor 950 through the IGBT 701a over the upper arm. Thus, the flywheel diode 601b repeats non-conduction and conduction according to ON and OFF of the IGBT 701a.

Figure 22:
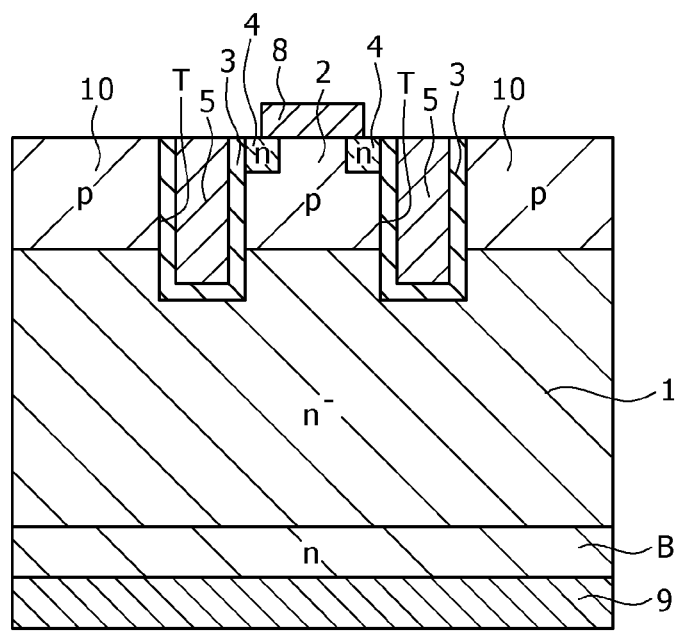
FIG. 22 is a principal part sectional view showing a semiconductor device of a comparative example 1 of the example 1.

FIG. 22 is a principal part sectional view showing a semiconductor device of a comparative example 1 of this example. Also in the semiconductor device of FIG. 22, an IGBT that has the n$^-$-type drift layer 1, the n-type source region 4, the p-type channel region 2 between them, the gate insulating film 3, and the gate electrode 5 is arranged on the surface side of the substrate (the n$^-$-type drift layer 1). However, in this case, only an n-type buffer layer B is provided between the n$^-$-type drift layer 1 and the collector electrode 9, and it does not have a diode function. Therefore, for example, when applying it to the inverter shown in FIG. 21, it is necessary to incorporate flywheel diodes (601a to 603a and 601b to 603b) as other chips.

Specifically, in the semiconductor device of the comparative example 1 (the IGBT, also refer to Patent Literature 2, Nonpatent Literature 3, etc., for example), at the time of non-conduction of the IGBT (at the time of OFF), namely, when the flywheel diode coupled in reverse parallel is made conductive, even if a positive voltage (for example, about 1 to 2 V) is applied to the emitter electrode 8, since the p-n junction comprised of the p-type channel region 2 and the n$^-$-type drift layer 1 is reverse biased, a current will not flow into the IGBT. That is, it does not perform reverse conduction and cannot function as a diode.

Figure 23:
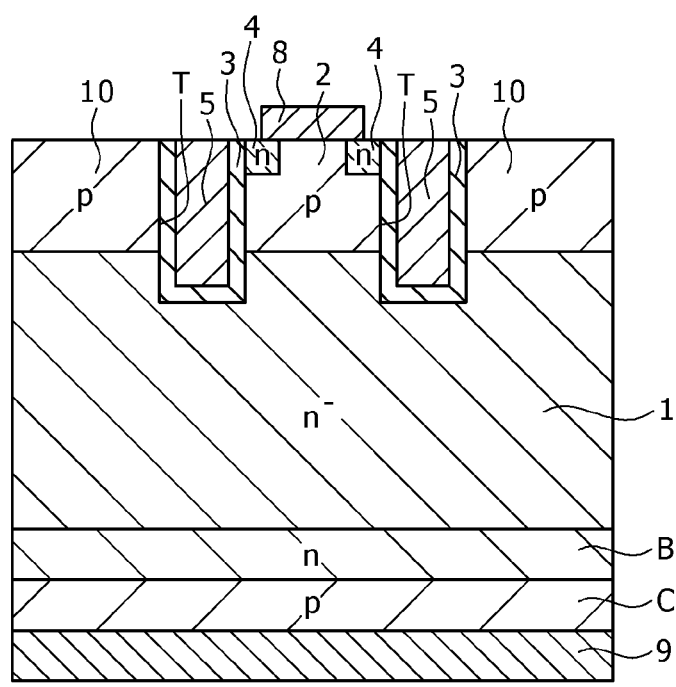
FIG. 23 is a principal part sectional view showing a semiconductor device of a comparative example 2 of the example 1.

FIG. 23 is a principal part sectional view showing a semiconductor device of a comparative example 2 of this example. In the semiconductor device (the IGBT) of FIG. 23, although the n-type buffer layer B and a p-type collector layer C are provided between the n$^-$-type drift layer 1 and the collector electrode 9, a junction part of these n-type buffer layer B and p-type collector layer C does not function as a diode. That is, the IGBT does not perform reverse conduction at the time of non-conduction (at the time of OFF), and cannot function as a diode.

By contrast, in the semiconductor device of this example, when a positive voltage (for example, about 1 to 2 V) is applied to the emitter electrode 8, a current flows. That is, it performs reverse conduction.

FIG. 2 shows an output characteristic of the diode comprised of a high-concentration p-n junction. For example, in the high-concentration p-n junction comprised of the high-concentration n-type region 6 and the high-concentration p-type region 7, when a positive voltage is applied between an anode (the high-concentration p-type region 7) and a cathode (the high-concentration n-type region 6), after a current rises from 0 V (zero volts), with increasing voltage, the characteristic passes a region (negative resistance) where the current decreases, and the current increases again (a first quadrant I). On the other hand, a negative voltage is applied (namely, a reverse bias is applied), a current flows in a reverse direction (a third quadrant III). A diode that exhibits such an output characteristic is called a tunnel diode or the Esaki diode after a name of the discoverer.

That is, in this example, the diode is made to operate as an IGBT at the time of IGBT operation (at the time of ON) using a characteristic shown in a halftone dot meshing portion of the first quadrant I. Specifically, after applying a positive voltage (for example, a voltage of about a few tens to a few thousands of volts) between the emitter electrode 8 and the collector electrode 9, a voltage of a few tens of volts (for example, a voltage of about 15 V) is applied between the gate electrode 5 and the emitter electrode 8.

By the voltage applied to the gate electrode 5, a channel (an inversion layer) is formed in a boundary portion of the p-type channel region 2 and the gate insulating film 3. This inversion layer electrically couples the n$^-$-type drift layer 1 and the n-type source region 4, and electrons are injected from the n-type source region 4 into the n$^-$-type drift layer 1. This flow of electrons acts as a base current of a bipolar transistor comprised of the n$^-$-type drift layer 1, the p-type channel region 2, and the n-type source region 4, and brings the bipolar transistor into conduction. That is, by the above-mentioned electrons, injection of holes from the collector electrode 9 side is urged, and the holes injected from the collector electrode 9 side pass through the n$^-$-type drift layer 1, and further flows into the emitter electrode 8 through the p-type channel region 2. In this way, the collector current flows (the IGBT turns on). When this is done, since the above-mentioned electrons and holes are supplied to the n$^-$-type drift layer 1, surplus electrons and holes are accumulated in the n$^-$-type drift layer 1. This is a phenomenon called conductivity modulation, which makes the resistance at the time of the IGBT conduction (at the time of ON) reduce largely.

On the other hand, when not making it operate as the IGBT (at the time of OFF), it is made to operate as a diode using the characteristic shown in a halftone dot meshing portion of the third quadrant III. Specifically, the diode is made conductive using a tunnel phenomenon. In other words, the IGBT is put into reverse conduction.

Figure 3:
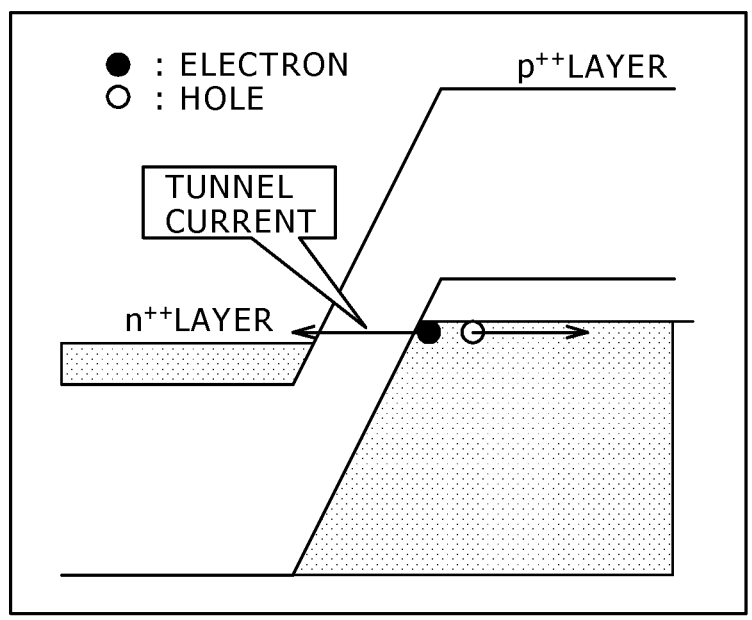
FIGS. 3 (A) and (B) are band diagrams for explaining a conduction mechanism of a current flowing through the high-concentration p-n junction.
Figure 3:
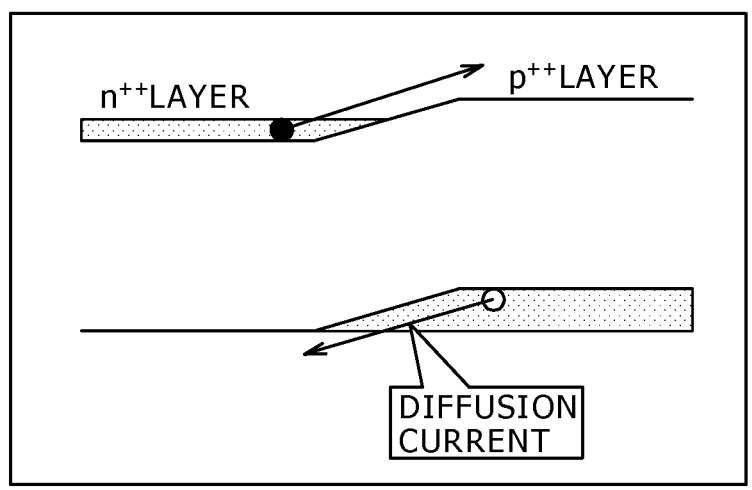

FIG. 3 is a band diagram for explaining a conduction mechanism of a current flowing through the high-concentration p-n junction. FIG. 3 (A) is a band diagram in the case where the diode of this example becomes conductive, and corresponds to the halftone dot meshing portion of the third quadrant III of FIG. 2. As shown in FIG. 3 (A), when a positive voltage (for example, about 1 to 2 V) is applied to the emitter electrode 8, electrons flow from a p$^{++}$ layer (the high-concentration p-type region 7) toward an n$^{++}$ layer (the high-concentration n-type region 6) in the diode by the tunnel phenomenon. That is, the tunnel current flows from the high-concentration n-type region 6 to the high-concentration p-type region 7.

On the other hand, FIG. 3 (B) is a band diagram at the time of the IGBT conduction of this example (at the time of ON), which corresponds to the halftone dot meshing portion of the first quadrant I of FIG. 2. At this time, the holes flow from the p$^{++}$ layer (the high-concentration p-type region 7) toward the n$^{++}$ layer (the high-concentration n-type region 6) by diffusion. Therefore, the diode (the high-concentration p-n junction part; here, the high-concentration n-type region 6 and the high-concentration p-type region 7) does not inhibit conduction of the IGBT.

Thus, by providing a high-concentration p-n junction part (6, 9), it is possible to produce the above-mentioned tunnel phenomenon. It is desirable that the impurity concentrations of the high-concentration n-type region 6 and the high-concentration p-type region 7 for producing the tunnel phenomenon effectively be more than or equal to $1 \times 10^{19}$ cm$^{-3}$, as described above. Moreover, examination of upper limits of the impurity concentrations by the inventors has given a finding that when the impurity concentrations are too high, an ON resistance at the time of the IGBT conduction (at the time of ON) becomes high.

Figure 4:
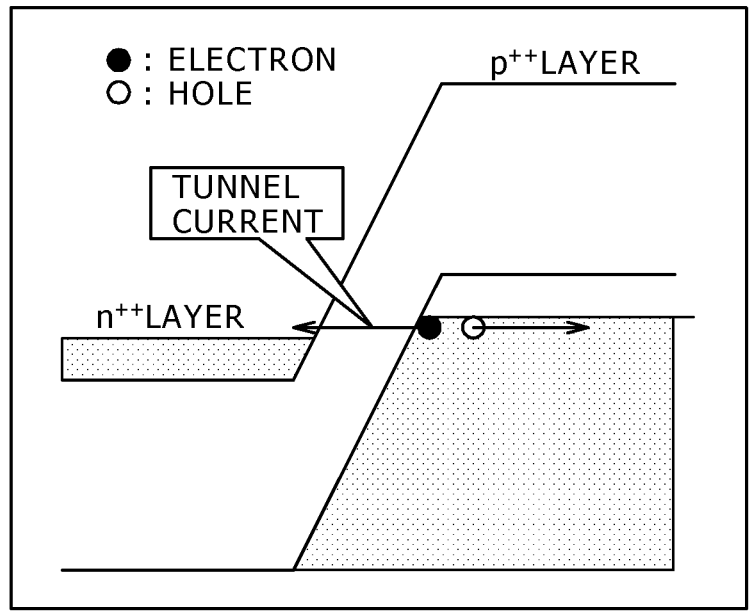
FIGS. 4 (A) and (B) are band diagrams for explaining the conduction mechanism of the current flowing through the p-n junction when impurity concentrations of a high-concentration p-n junction part are larger than $3 \times 10^{20}$ cm$^{-3}$.
Figure 4:
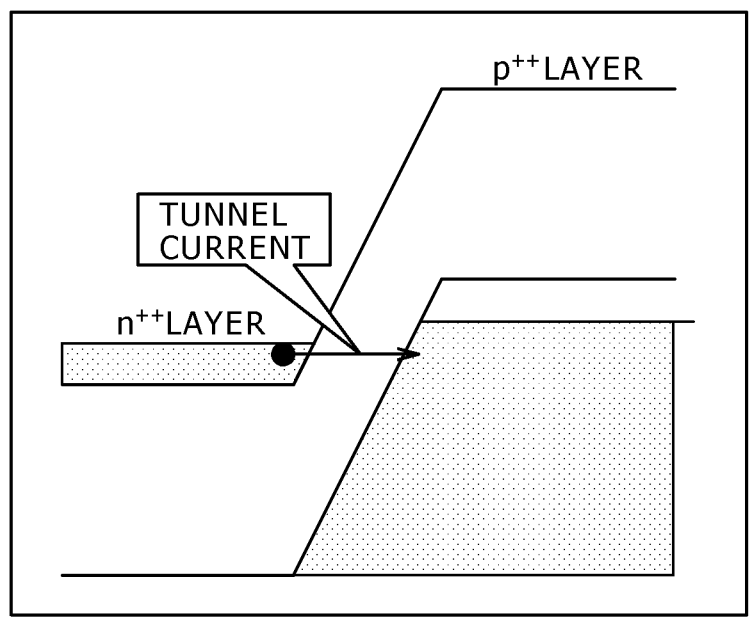

FIG. 4 is a band diagram for explaining a conduction mechanism of the current flowing through the p-n junction when the impurity concentrations of the high-concentration p-n junction part are larger than $3 \times 10^{20}$ cm$^{-3}$. As shown in FIG. 4 (A), when the diode becomes conductive, a current flows by the tunnel phenomenon like FIG. 3 (A). However, when it becomes conductive as the IGBT, as shown in FIG. 4 (B), since electrons flow from the high-concentration n-type region 6 (n$^{++}$ layer) into the high-concentration p-type region 7 (p$^{++}$ layer) by the tunnel phenomenon, holes are not injected from the high-concentration n-type region 6 (n$^{++}$ layer) into the n$^-$-type drift layer 1, and the conductivity modulation described above is suppressed. For this reason, the ON resistance becomes high and the ON voltage cannot but be enlarged.

By the above, by setting the impurity concentration of the high-concentration p-n junction part to be in a range of not less than $1 \times 10^{19}$ cm$^{-3}$ and not more than $3 \times 10^{20}$ cm$^{-3}$, it is possible to make it operated as the IGBT with the built-in diode, and at the same time to suppress increase of the ON voltage of the IGBT.

Furthermore, the inventors has examined a configuration of the high-concentration p-n junction to find out that there is a more suitable range about the thickness of the high-concentration n-type region 6 (n$^{++}$ layer) and the thickness of the high-concentration p-type region 7 (p$^{++}$ layer).

That is, since when the high-concentration n-type region 6 (n$^{++}$ layer) is thick, the holes injected from the high-concentration n-type region 6 (n$^{++}$ layer) become easy to recombine with electrons in the high-concentration n-type region 6 (n$^{++}$ layer) at the time of the IGBT conduction (at the time of ON), the holes become hard to be injected into the n$^-$-type drift layer 1. This suppresses the conductivity modulation described above. Therefore, from the viewpoint of producing the conductivity modulation efficiently, it is desirable that the thickness of the high-concentration n-type region 6 (n$^{++}$ layer) be set to less than or equal to 50 nm.

Moreover, since in the case where the high-concentration p-type region 7 (p$^{++}$ layer) is too thick, holes injected from the high-concentration p-type region 7 (p$^{++}$ layer) increase at the time of the IGBT conduction (at the time of ON), a loss when the IGBT turns OFF (a turn-off loss) increases. Therefore, from the viewpoint of reduction of this turn-off loss, it is desirable that the thickness of the high-concentration p-type region 7 (p$^{++}$ layer) be set to less than or equal to 50 nm.

Figure 24:
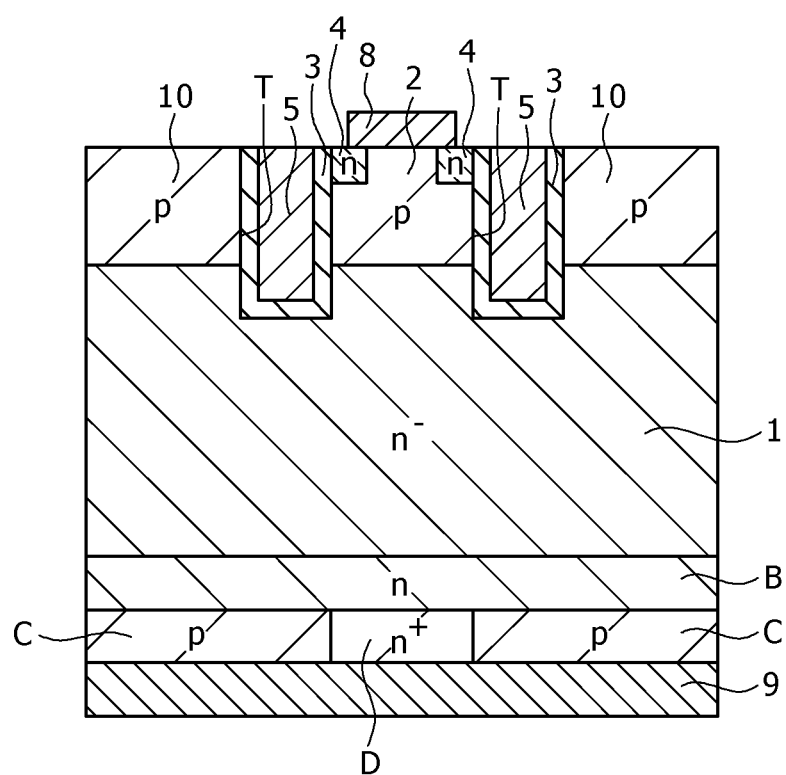
FIG. 24 is a principal part sectional view showing a semiconductor device of a comparative example 3 of the example 1.

On the other hand, as the IGBT with the built-in diode, it is considerable that it adopts a configuration of a semiconductor device shown in FIG. 24. FIG. 24 is a principal part sectional view showing a semiconductor device of a comparative example 3 of this example. In FIG. 24, the IGBT that has the n$^-$-type drift layer 1, the n-type source region 4, the p-type channel region 2 between them, the gate insulating film 3, and the gate electrode 5 is arranged on the surface side of the substrate (the n$^-$-type drift layer 1). Furthermore, the n-type buffer layer B and the p-type collector layer C are provided between the n$^-$-type drift layer 1 and the collector electrode 9, and an n-type layer D is provided so as to divide the p-type collector layer C. A pin-type diode is comprised of these n-type layer D, p-type channel region 2, and n$^-$-type drift layer 1. The semiconductor device of this configuration may be called a "reverse conduction IGBT of a collector short structure."

Figure 25:
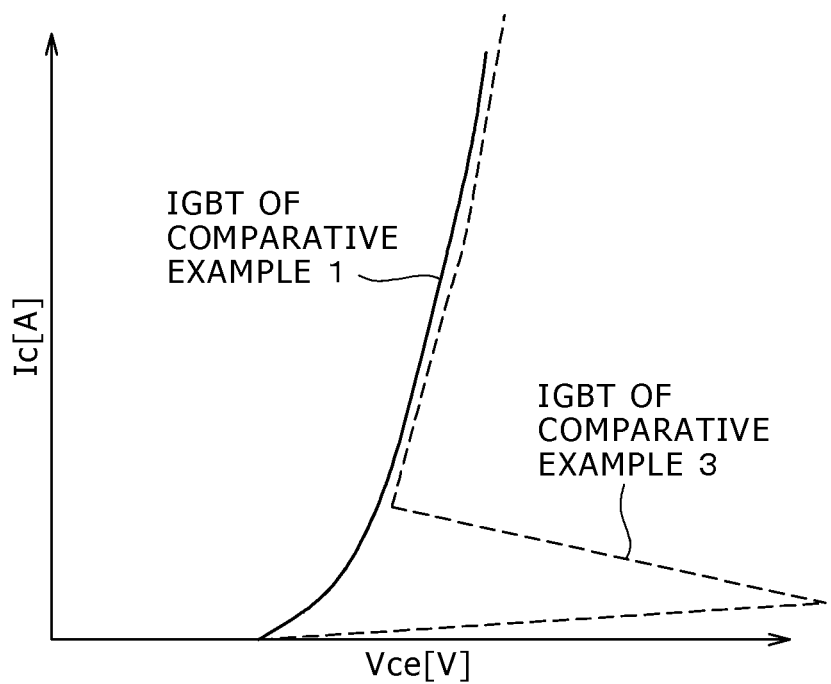
FIG. 25 is a graph showing forward output characteristics of the semiconductor devices of the comparative example 1 and the comparative example 3.

However, the semiconductor device of the above-mentioned comparative example 3 poses a problem that what is called "snap back" arises in the forward output characteristic. FIG. 25 is a graph showing the forward output characteristics of the semiconductor devices of the comparative example 1 and the comparative example 3.

A horizontal axis represents a collector voltage Vce [V] and a vertical axis represents a collector current Ic [A]. As shown in the diagram, in collector current vs. collector voltage characteristic (solid line) of the semiconductor device of the comparative example 1, i.e., the IGBT that is not in reverse conduction, when the collector voltage becomes a diffusion voltage (for example, about 0.7 V) of the p-n junction, the collector current rises and increases exponentially. On the other hand, in the collector current vs. collector voltage characteristic (dotted line) of the semiconductor device of the comparative example 3, i.e., a reverse conduction IGBT of a collector short structure, a collector current does not rise even when the collector voltage becomes the diffusion voltage (for example, about 0.7 V), after a voltage more than or equal to the diffusion voltage is applied, the collector voltage steeply descends temporality, and the collector current increases after that. This phenomenon is called the "snap back."

In the semiconductor device (the IGBT with the built-in diode) of the comparative example 3, when the collector voltage is increased, the collector current flows being concentrated in the n-type region D of the collector short; and when the collector voltage is increased further, holes are injected from the p-type channel region 2 into the n$^-$-type drift layer 1 (the IGBT operation), a resistance of the n$^-$-type drift layer 1 decreases by conductivity modulation, and the collector voltage lowers. The "snap back" arises at a timing when the above-mentioned MISFET operation switches to the IGBT operation.

Furthermore, the semiconductor device (the IGBT with the built-in diode) of the comparative example 3 also poses a problem of "current concentration" in addition to the above-mentioned "snap back." For example, when the semiconductor device is operating as a diode, a diode current flows being concentrated in the n-type layer D of the collector short. For this reason, a forward voltage drop of the diode will increase and degradation of device characteristics will be caused.

By contrast, according to the above-mentioned configuration of this example, since it is not configured so that the current flows locally in the n-type layer D as in the example 3 and the current flows in the whole surface of a region in contact with the collector electrode 9 (the high-concentration p-n junction part 6, 7), it can avoid the above-mentioned problems of the "snap back" and the "current concentration" [effect 2].

[Manufacturing Method Explanation]

Next, a manufacturing method of the semiconductor device of this example will be explained referring to FIG. 5 to FIG. 10, and a configuration of this particular semiconductor device will also be made clearer. FIG. 5 to FIG. 10 are principal part sectional views showing a manufacturing process of the semiconductor device of this example.

Figure 5:
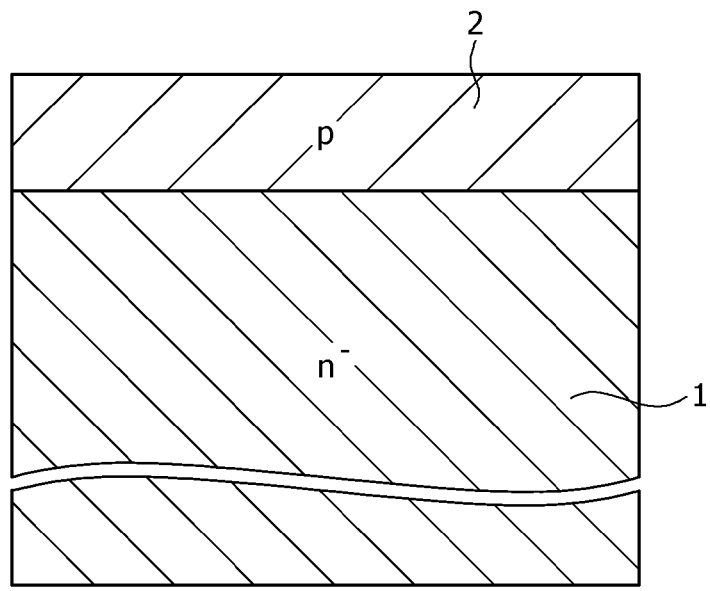
FIG. 5 is a principal part sectional view showing a manufacturing process of the semiconductor device of the example 1.

First, as shown in FIG. 5, the p-type channel region (the p-type semiconductor region) 2 is formed on the surface (the first face, the upper surface) of the substrate (the semiconductor substrate) comprised of n$^-$-type single crystal silicon containing an n-type (a first conductivity type) impurity (for example, phosphor (P), etc.). The p-type channel region 2 is formed by ion implanting a p-type (a second conductivity type) impurity (for example, boron (B), etc.). The substrate comprised of the above-mentioned n$^-$-type single crystal silicon serves as the n$^-$-type drift layer (the n-type semiconductor region) 1. Incidentally, a substrate that has an n$^-$-type silicon layer (the n$^-$-type drift layer 1) epitaxially grown over a supporting substrate comprised of n$^+$-type single crystal silicon containing an n-type impurity may be used and the p-type channel region 2 may be formed on its surface.

Figure 6:
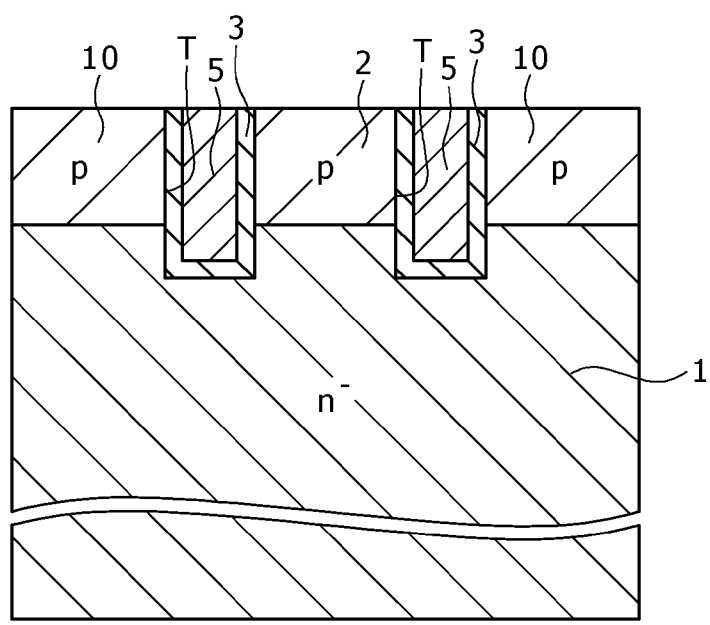
FIG. 6 is a principal part sectional view showing the manufacturing process of the semiconductor device of the example 1.

Next, as shown in FIG. 6, the trench type gate electrode (the conductive film) 5 is formed. First, the p-type channel region 2 and the n⁻-type drift layer 1 are dry etched by using a photoresist film (not illustrated) exposed and developed using a photolithography technology as a mask to form the trench T. This trench T penetrates the p-type channel region 2 and reaches to the n⁻-type drift layer 1. Next, the gate insulating film 3 is formed over side walls and a bottom of the trench T. For example, the gate insulating film 3 comprised of a silicon oxide film is formed over the side walls and the bottom of the trench T by performing thermal oxidation treatment on the substrate. Subsequently, over the substrate containing the inside of the trench T, a polycrystalline silicon film in which, for example, an n-type impurity (for example, phosphor (P)) was doped is deposited as a conductive film by using a CVD (Chemical Vapor Deposition) method, etc. at a film thickness to embed the trench T roughly. Next, the gate electrode 5 is formed, for example, by etching back the whole surface of the above-mentioned polycrystalline silicon film and making the polycrystalline silicon film remain in the inside of the trench T.

Figure 7:
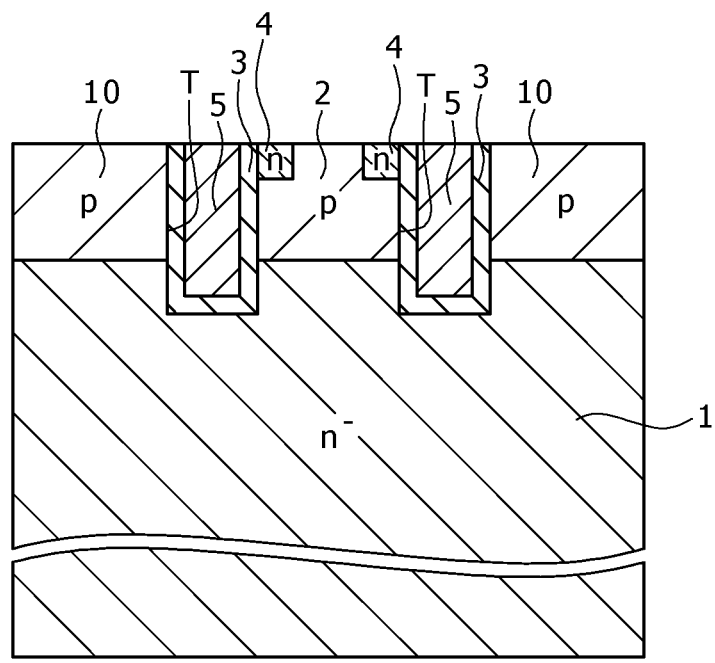
FIG. 7 is a principal part sectional view showing the manufacturing process of the semiconductor device of the example 1.

Next, as shown in FIG. 7, the n-type source region (the n-type semiconductor region) 4 is formed so as to contact the trench T over the surface of the p-type channel region 2 in the vicinity of the gate electrode 5 by the photolithography technology. The n-type source region 4 is formed by ion implanting an n-type (the first conductivity type) impurity (for example, phosphor (P), etc.) by using a photoresist film (not illustrated) exposed and developed using the photolithography technology as a mask. Incidentally, the p-type semiconductor region (the p-type channel region 2) in which the n-type source region 4 is not formed is called a p-type well 10.

By the steps so far mentioned, it is possible to form the IGBT that is comprised of the n⁻-type drift layer 1 as a drain region, the n-type source region (the n-type semiconductor region) 4 as a source region, and the p-type channel region (the p-type semiconductor region) 2 between them as a channel region, in which the gate electrode 5 is arranged through the gate insulating film 3 that contacts this channel region.

Figure 8:
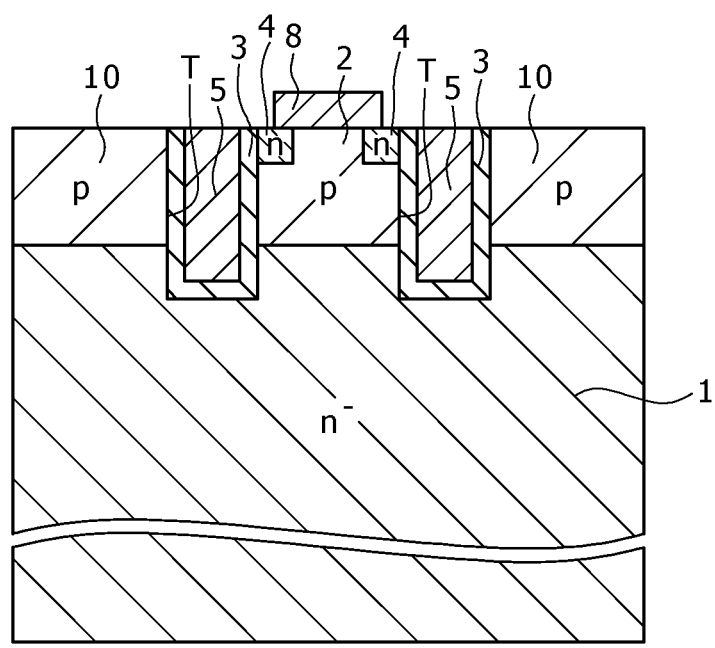
FIG. 8 is a principal part sectional view showing the manufacturing process of the semiconductor device of the example 1.

Next, as shown in FIG. 8, the emitter electrode 8 electrically coupled with the n-type source region 4 is formed. For example, an aluminum (Al) film is deposited by a sputtering process, etc. over the substrate as a conductive film, for example. Incidentally, for example, a tungsten nitride (TiW) film, etc. may be formed between the substrate and the Al film as a barrier conductor film. Then, the emitter electrode 8 is formed by etching (dry etching or wet etching) the Al film using a photoresist film that is patterned by the photolithography technology as a mask.

Figure 9:
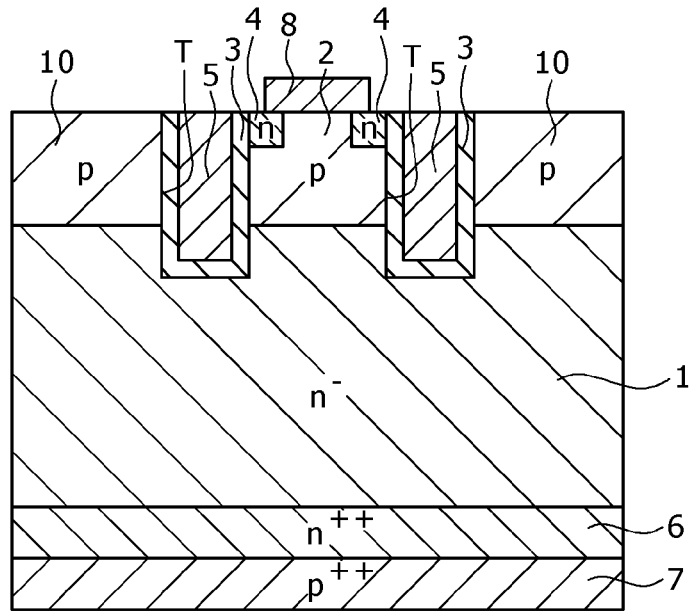
FIG. 9 is a principal part sectional view showing the manufacturing process of the semiconductor device of the example 1.

Next, as shown in FIG. 9, the back (a face that is reverse to the first face, a second face, an undersurface) side of the substrate, i.e., the n⁻-type drift layer 1 is thinned in thickness from the back side. For example, after protecting the surface of the substrate with tape, etc., the back of the n⁻-type drift layer 1 is ground with the protected surface facing downward.

Next, the high-concentration n-type region 6 and the high-concentration p-type region 7 of which the diode is comprised are formed on the back side (the ground face) of the n⁻-type drift layer 1. For example, the high-concentration n-type region 6 is formed by ion implanting an n-type impurity (for example, phosphor (P), etc.) from the back side of the n⁻-type drift layer 1. Next, the high-concentration p-type region 7 is formed by ion implanting a p-type impurity (for example, boron (B), etc.) from the back side of the n⁻-type drift layer 1. Then, a heat treatment (annealing) is performed to activate the injected impurity. Incidentally, a formation order of the high-concentration n-type region 6 and the high-concentration p-type region 7 may be reversed. In doing this, the high-concentration p-type region 7 is formed on the back side of the n⁻-type drift layer 1, as shown in FIG. 9, and regarding the high-concentration n-type region 6, ion implantation conditions such as ion implantation energy are adjusted so that it may extend at a location deeper than the high-concentration p-type region 7 when seeing from the back side of the n⁻-type drift layer 1. Moreover, about a temperature of the above-mentioned heat treatment (annealing), it is desirable to set the temperature to lower than or equal to 600° C. in the vicinity of the emitter electrode 8 so that the characteristic of the emitter electrode 8 comprised of the Al film may not be degraded, and at the same time to set the temperature to higher than or equal to 800° C. in the vicinity of the high-concentration n-type region 6 and the high-concentration p-type region 7 in order to improve activity of the impurity. For example, local heat treatment is possible by laser annealing, which makes it possible to keep vicinities of the high-concentration n-type region 6 and the high-concentration p-type region 7 at a sufficient high temperature, and at the same time to suppress temperature rise in the vicinity of the emitter electrode 8, and is effective as heat treatment means.

Figure 10:
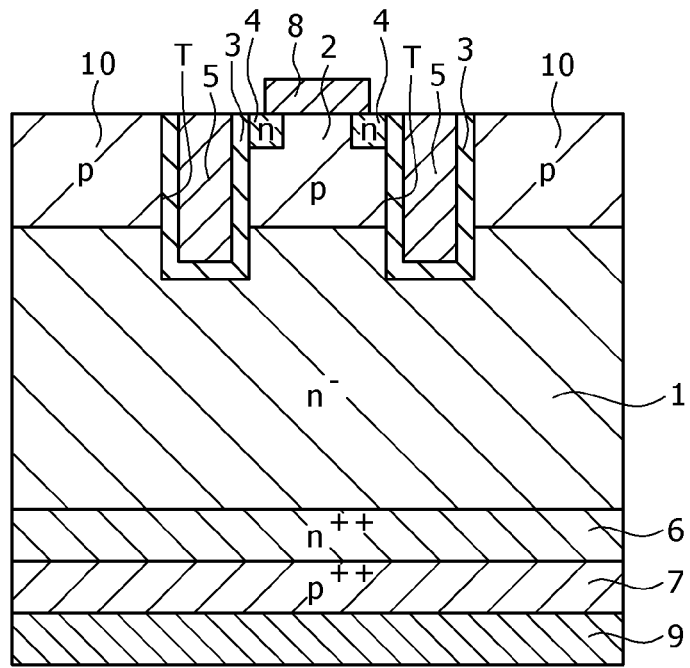
FIG. 10 is a principal part sectional view showing the manufacturing process of the semiconductor device of the example 1.

Next, as shown in FIG. 10, over the back of the substrate, i.e., the back of the n⁻-type drift layer 1 (here, the high-concentration p-type region 7), layered films of, for example, a titanium (Ti) film, a nickel (Ni) film, and a gold (Au) film, are deposited as a conductive film by the sputtering process, etc. to form the collector electrode 9 comprised of these layered films.

After this, the above-mentioned tape of the surface of the substrate is removed, the substrate in a wafer state is diced along division regions to be made into multiple chips. Furthermore, each chip is placed, for example, over a mount board having an external terminal, etc., and is sealed with resin, etc. (being packaged). Thereby, the semiconductor device of this example is virtually completed.

Incidentally, although in the semiconductor device (FIG. 1) of this example, one piece of the IGBT and the diode were shown and explained, a structure where the above-mentioned multiple portions (the IGBTs and the diodes) are repeatedly arranged is being adopted in power semiconductors in order to obtain a large electric power.

Example 2

In the example 1, although the high-concentration n-type region 6 and the high-concentration p-type region 7 were formed by ion implantation, respectively, these regions may be formed by epitaxial growth. Incidentally, since a configuration of a semiconductor device of this example is the same as the configuration (including its operation) explained referring to the FIG. 1, etc. in the example 1, its explanation is omitted.

Figure 11:
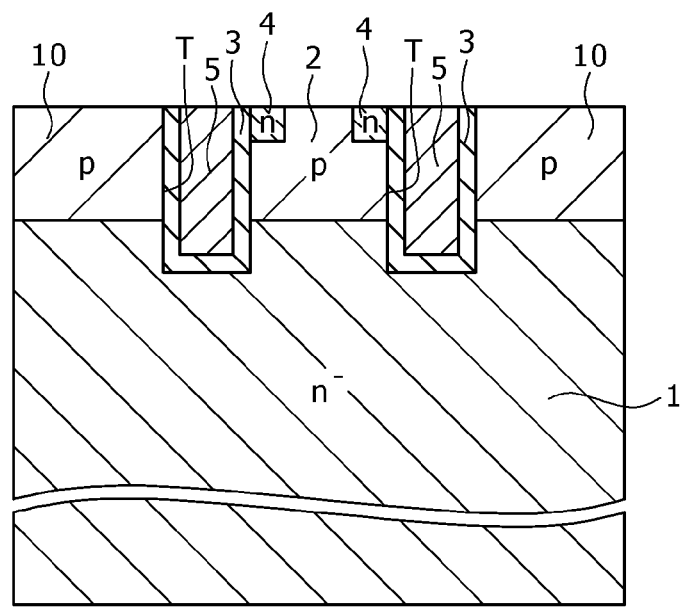
FIG. 11 is a principal part sectional view showing a manufacturing process of a semiconductor device of an example 2.
Figure 12:
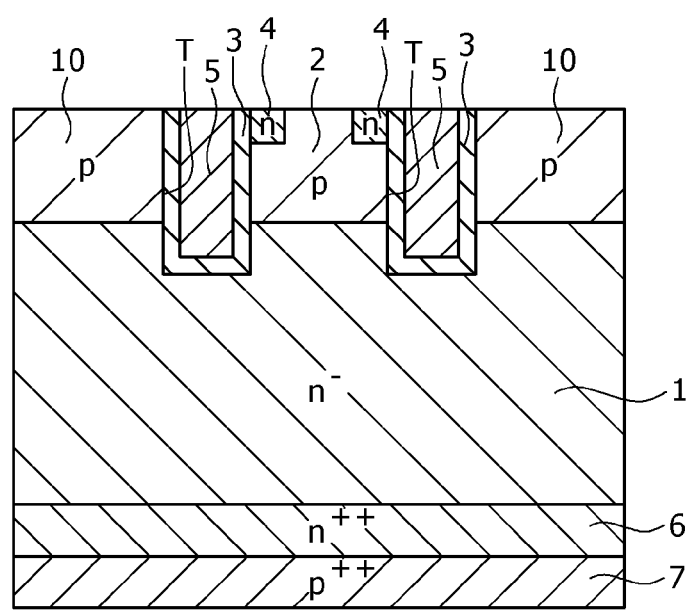
FIG. 12 is a principal part sectional view showing the manufacturing process of the semiconductor device of the example 2.
Figure 13:
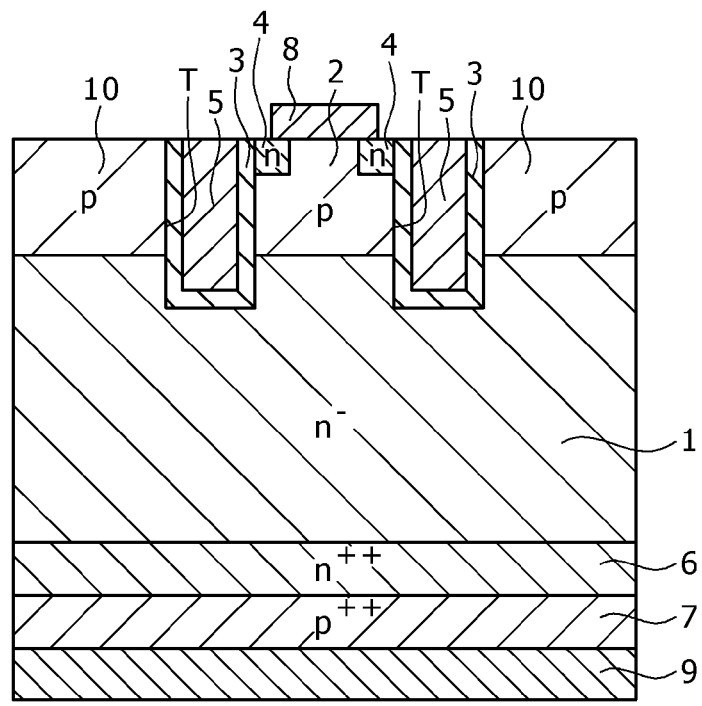
FIG. 13 is a principal part sectional view showing the manufacturing process of the semiconductor device of the example 2.

FIG. 11 to FIG. 13 are principal part sectional views showing a manufacturing process of the semiconductor device of this example. Hereinafter, the manufacturing process of the semiconductor device of this example will be explained referring to drawings.

An IGBT is formed over a principal surface of the substrate as shown in FIG. 11. Incidentally, since this formation process of the IGBT is the same as that of the case of the example 1 explained referring to FIG. 5 to FIG. 7, its detailed explanation is omitted. That is, the p-type channel region 2 is formed on the surface of the substrate comprised of n⁻-type single crystal silicon (the n⁻ type drift layer), and subsequently the trench T that penetrates the p-type channel region 2 and reaches to the n⁻-type drift layer 1 is formed. Next, the gate insulating film 3 and the gate electrode 5 are formed in the inside of the trench T, and further the n-type source region 4 is formed on the surface of the p-type channel region 2 in the vicinity of the gate electrode 5. Thereby, it is possible to form the IGBT that is comprised of the n⁻-type drift layer 1 as a drain region, the n-type source region 4 as a source region, and the p-type channel region 2 between them as a channel region, in which the gate electrode 5 is arranged through the gate electrode 3 that contacts this channel region.

Next, as shown in FIG. 12, the back (a face that is reverse to the first face, a second face, an undersurface) side of the substrate, i.e., the n⁻-type drift layer 1 is thinned in thickness from the back side. For example, after protecting the surface of the substrate with tape, etc., the back of the n⁻-type drift layer 1 is ground with the protected surface facing downward.

Next, the high-concentration n-type region 6 and the high-concentration p-type region 7 of which the diode is comprised are formed on the back side (ground surface) of the n⁻-type drift layer 1. For example, the high-concentration n-type region 6 is formed by epitaxially growing a single crystal silicon layer on the back of the n⁻-type drift layer 1 while doping an n-type impurity (for example, phosphor (P), etc.). Next, the high-concentration p-type region 7 is formed by epitaxially growing a single crystal silicon layer over the high-concentration n-type region 6 while doping a p-type impurity (for example, boron (B), etc.).

Next, as shown in FIG. 13, the emitter electrode 8 and the collector electrode 9 are formed over the surface of the substrate and over the back of the substrate, respectively. Although there is no restriction to an order of these formation steps, the emitter electrode 8 is formed by removing the above-mentioned tape over the surface of the substrate, depositing, for example, an Al film by the sputtering process, etc. over the substrate as a conductive film, and subsequently etching it into a desired shape. Next, over the back of the substrate, i.e., the back of the n⁻-type drift layer 1 (here, the high-concentration p-type region 7), layered films of, for example, a titanium (Ti) film, a nickel (Ni) film, and a gold (Au) film are deposited as a conductive film by the sputtering process, etc. to form the collector electrode 9 comprised of these layered films.

After this, the substrate in a wafer state is diced along division regions to obtain multiple chips. Furthermore, an individual chip is mounted over, for example, amount board having external terminals and is sealed with resin, etc. (being packaged). Thereby, the semiconductor device of this example is virtually completed.

Thus, by forming the emitter electrode 8 after forming the high-concentration n-type region 6 and the high-concentration p-type region 7 by epitaxial growth, an epitaxial growth temperature can be made higher than or equal to a melting point of Al (for example, 900° C. or higher), and an epitaxial layer having excellent characteristics can be formed. Moreover, highly versatile Al can be used as an electrode by forming the emitter electrode 8 thereafter.

Example 3

Figure 14:
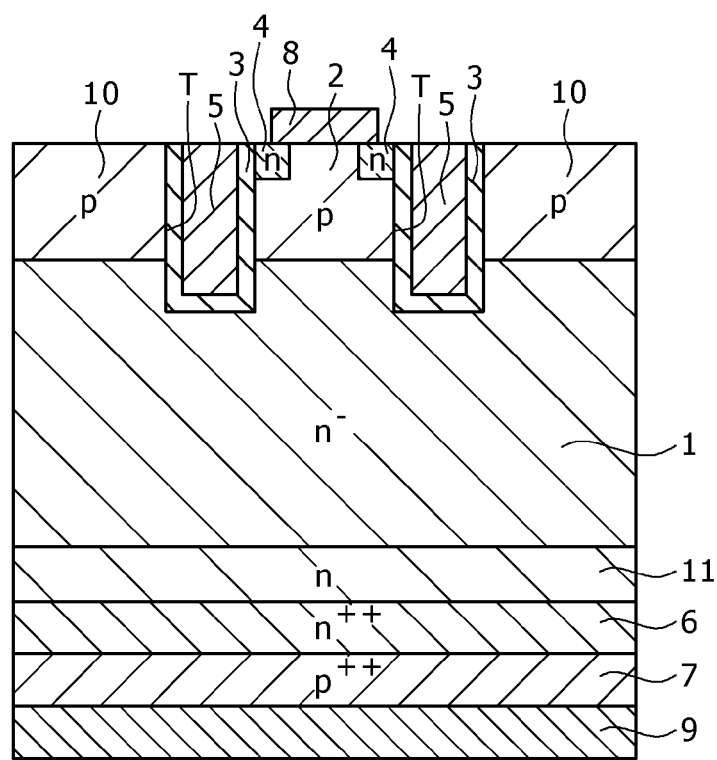
FIG. 14 is a principal part sectional view showing a semiconductor device of an example 3.

In this example, an n-type buffer layer 11 is provided between the n⁻-type drift layer 1 and the high-concentration n-type region 6 of the example 1.
[Structure Explanation]
FIG. 14 is a principal part sectional view showing a semiconductor device of this example. Like the example 1 (FIG. 1), the semiconductor device of this example has an IGBT and a diode, and is the IGBT with the built-in diode.

That is, like the example 1, the IGBT that has the n⁻-type drift layer 1, the n-type source region 4, the p-type channel region 2 between them, the gate insulating film 3, and the gate electrode 5 is arranged on the surface side of the substrate (the n⁻-type drift layer 1). Furthermore, a diode that has the high-concentration n-type region 6 and the high-concentration p-type region 7 is arranged on the back side of the substrate (the n⁻-type drift layer 1). Moreover, the emitter electrode 8 electrically coupled with the n-type source region 4 is arranged on the surface side of the substrate (the n⁻-type drift layer 1); the collector electrode 9 is arranged over the high-concentration p-type region 7 on the back side of the substrate (the n⁻-type drift layer 1).

A difference from the example 1 (FIG. 1) is a point that the n-type buffer layer 11 is provided between the n⁻-type drift layer 1 and the high-concentration n-type region 6. The impurity concentration of this n-type buffer layer 11 is lower than the impurity concentration of the high-concentration n-type region 6, and is higher than the impurity concentration of the n⁻-type drift layer 1.

For example, in the semiconductor device of the comparative example 2 (FIG. 23), the n-type buffer layer B plays a role of suppressing a depletion layer from reaching to the p-type channel region 2. Also in this example, in addition to the effects explained in the example (for example, the above-mentioned effect 1 and effect 2), it is possible to hold down expansion of the depletion layer and to secure a withstand voltage by providing the n-type buffer layer 11. Moreover, if a withstand voltage design of the semiconductor device of the comparative example 2 (FIG. 23) is followed, the IGBT that incorporates the diode can be easily designed.
[Manufacturing Method Explanation]
The semiconductor device of this example can be formed similarly with the example 1. For example, in the example 1, when forming the high-concentration n-type region 6 and the high-concentration p-type region 7 of which the diode is comprised, what is necessary is just to form the n-type buffer layer 11 similarly by ion planting an n-type impurity (for example, phosphorus (P), etc.) from the back side of the substrate (the n⁻-type drift layer 1).

Example 4

Figure 15:
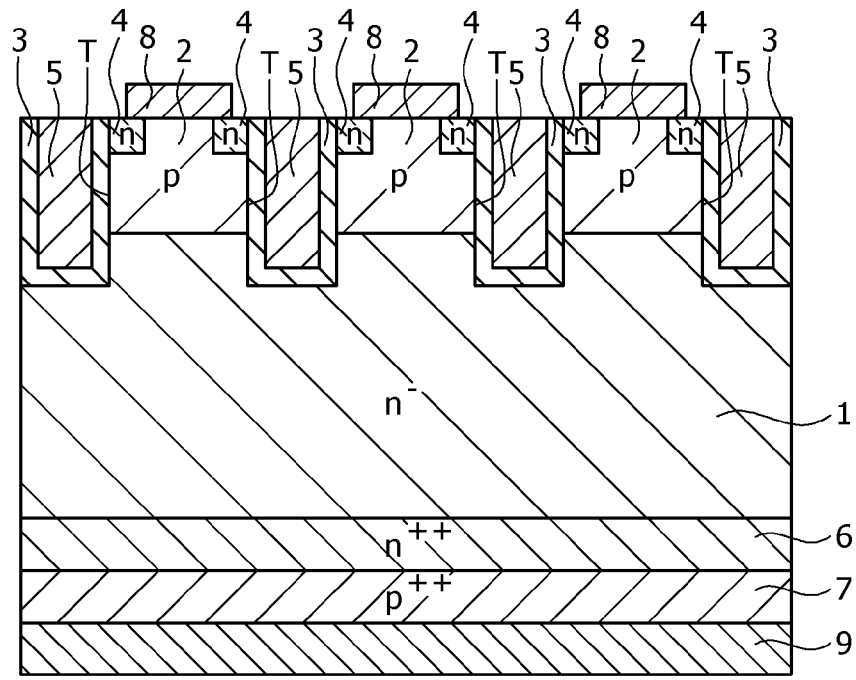
FIG. 15 is a principal part sectional view showing a semiconductor device of an example 4.

In the example 1 (FIG. 1), although the p-type channel region 2 was arranged to one side of the gate electrode 5 and the p-type well (the p-type semiconductor region) 10 was arranged on the other side of the gate electrode 5, this p-type well 10 may be omitted and the gate electrode 5 and the p-type channel region 2 may be arranged closely.
[Structure Explanation]
FIG. 15 is a principal part sectional view showing a semiconductor device of this example. Like the example 1 (FIG. 1), the semiconductor device of this example has an IGBT and a diode, and is the IGBT with the built-in diode.

That is, like the example 1, the IGBT that has the n⁻-type drift layer 1, the n-type source region 4, the p-type channel region 2 between them, the gate insulating film 3, and the gate electrode 5 is arranged on the surface side of the substrate (the n⁻-type drift layer 1). Furthermore, a diode that has the high-concentration n-type region 6 and the high-concentration p-type region 7 is arranged on the back side of the substrate (the n⁻-type drift layer 1). Moreover, the emitter electrode 8 electrically coupled with the n-type source region 4 is arranged on the surface side of the substrate (the n⁻-type drift layer 1); the collector electrode 9 is arranged over the high-concentration p-type region 7 on the back side of the substrate (the n⁻-type drift layer 1).

A difference from the example 1 (FIG. 1) is a point that the p-type well 10 is omitted, and the gate electrode 5 and the p-type channel region 2 are formed repeatedly and densely.

The p-type well 10 of the example 1 (FIG. 1) is coupled to none of the gate electrode 5, the emitter electrode 8, and the collector electrode 9, and is in a floating state. In the case where such a p-type well 10 in the floating state is provided, element breakdown by an overcurrent of the IGBT can be reduced, and reduction of conduction loss and reduction of the ON voltage can be achieved.

On the other hand, since the p-type well 10 becomes a floating state electrically, when the IGBT turns ON, a potential of the p-type well 10 rises, a potential of the gate electrode 5 rises through a parasitic capacitance between the p-type well 10 and the gate electrode 5, and turn-on of the IGBT is accelerated. For this reason, a rate of change (di/dt) of the collector current becomes large, and there is a possibility that an electromagnetic interference (EMI) noise may increase.

By contrast, according to this example, in addition to the effects explained in the example 1 (for example, the above-mentioned effect 1 and effect 2), it is possible to suppress the above-mentioned EMI noise by a configuration that omits the p-type well 10.

[Manufacturing Method Explanation]

The semiconductor device of this example can be formed similarly with the example 1. For example, what is necessary is just to form the n-type source region 4 and the emitter electrode 8 also in a region corresponding to the p-type well 10 of the example 1, and also to form the gate electrode 5 densely.

Example 5

In this example, an n-type hole barrier layer 12 is provided between the p-type channel region 2 and the n⁻-type drift layer 1 of the example 4.

[Structure Explanation]

Figure 16:
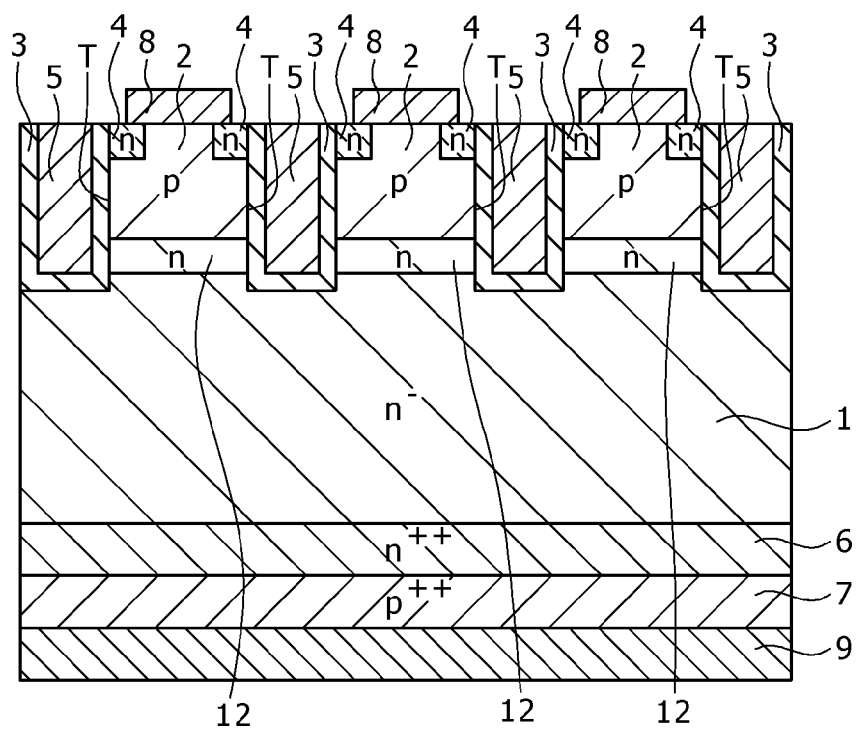
FIG. 16 is a principal part sectional view showing a semiconductor device of an example 5.

FIG. 16 is a principal part sectional view showing a semiconductor device of this example. Like the example 4 (FIG. 15), the semiconductor device of this example has an IGBT and a diode, and is the IGBT with the built-in diode.

That is, like the example 4, the IGBT that has the n⁻-type drift layer 1, the n-type source region 4, the p-type channel region 2 between them, the gate insulating film 3, and the gate electrode 5 is arranged on the surface side of the substrate (the n⁻-type drift layer 1). Furthermore, a diode that has the high-concentration n-type region 6 and the high-concentration p-type region 7 is arranged on the back side of the substrate (the n⁻-type drift layer 1). Moreover, the emitter electrode 8 electrically coupled with the n-type source region 4 is arranged on the surface side of the substrate (the n⁻-type drift layer 1); the collector electrode 9 is arranged over the high-concentration p-type region 7 on the back side of the substrate (the n⁻-type drift layer 1).

A difference from the example 4 (FIG. 15) is a point that the n-type hole barrier layer (n-type semiconductor region) 12 is provided between the p-type channel region 2 and the n⁻-type drift layer 1. Here, the trench T where the gate electrode 5 and the gate insulating film 3 are arranged penetrates the p-type channel region 2 and the n-type hole barrier layer 12, and reaches to the n⁻-type drift layer 1. Thus, the ON voltage at the time of the IGBT conduction can be reduced by providing the n-type hole barrier layer 12 in a lower part of the p-type channel region 2. The impurity concentration of this n-type hole barrier layer 12 is higher than the impurity concentration of the n⁻-type drift layer 1 and is lower than the impurity concentration of the high-concentration n-type region 6.

That is, in the configuration where the p-type well of the example 1 is omitted like this example, although the EMI noise can be reduced as described above, the holes injected from the high-concentration p-type region 7 (p⁺⁺ layer) become easy to enter the emitter electrode 8 via the p-type channel region 2 at the time of the IGBT conduction. As a result, the hole concentration of the n⁻-type drift layer 1 easily becomes low, and the ON voltage easily becomes high.

By contrast, in this example, since at the time of the IGBT conduction, the n-type hole barrier layer 12 plays a role of a gate to the holes, the holes becomes easy to remain in the n⁻-type drift layer 1, and the ON voltage can be reduced.

Thus, according to this example, in addition to the effects explained in the example 1 (for example, the above-mentioned effect 1 and effect 2), the ON voltage at the time of the IGBT conduction can be reduced by the configuration that provides the n-type hole barrier layer 12.

[Manufacturing Method Explanation]

The semiconductor device of this example can be formed similarly with the example 1. For example, what is necessary is just to form the n-type source region 4 and the emitter electrode 8 also in a region corresponding to the p-type well 10 of the example 1 and also to form the gate electrode 5 closely. Moreover, when forming the p-type channel region (the p-type semiconductor region) 2 over the surface of the substrate (the semiconductor substrate) comprised of n⁻-type single crystal silicon, the n-type hole barrier layer 12 has been formed in its lower layer by ion implanting an n-type (the first conductivity type) impurity (for example, phosphor (P), etc.). What is necessary is just to further form the trench T that penetrates the p-type channel region 2 and the n-type hole barrier layer 12 and reaches to the n⁻-type drift layer 1, and subsequently to form the gate insulating film 3 and the gate electrode 5 in its inside like the example 1.

Example 6

Although the IGBT of the "trench gate type" that was the so-called "vertical" MISFET was explained as the example in the example 1 (FIG. 1), as described above, structures of the IGBT include ones that are called the "vertical type" and the "horizontal type", and moreover there are also structures called a "trench gate type" and a "planar gate type" according to structures of the gate electrode part. Therefore, an IGBT that adopts another configuration may be used. Here, the "planar gate type" IGBT that is the "vertical" MISFET and the "planar gate type" IGBT that is the "horizontal" MISFET will be explained as examples.

(A) Structure Explanation

Figure 17:
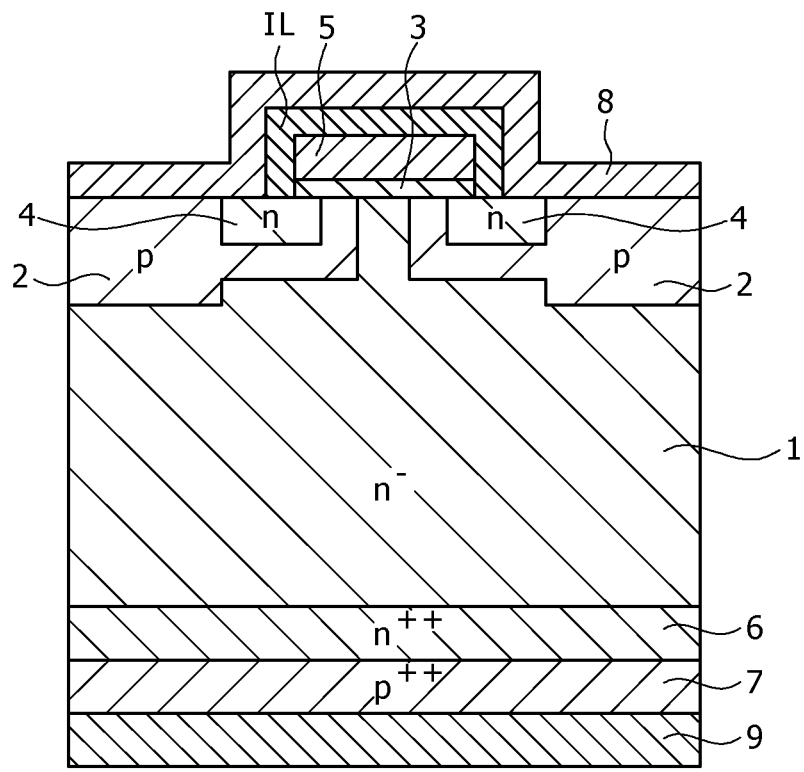
FIGS. 17 (A) and (B) are principal part sectional views showing a semiconductor device of an example 6.
Figure 17:
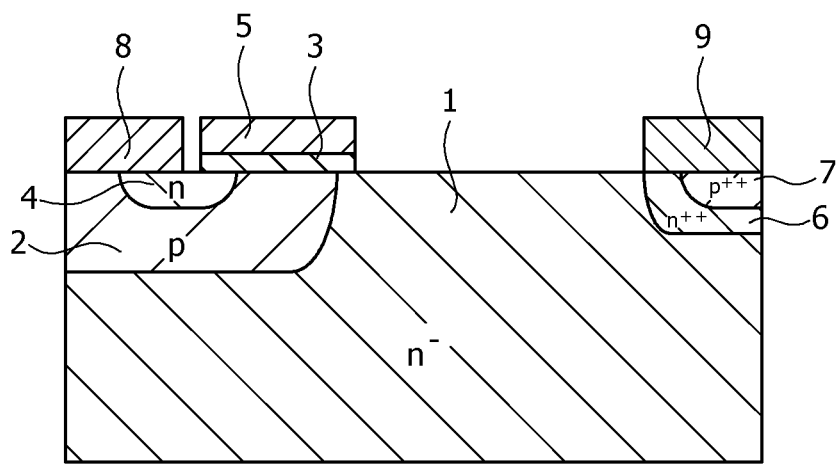

FIG. 17 is a principal part sectional view showing a semiconductor device of this example, and FIG. 17 (A) shows a configuration of the "planar gate type" IGBT that is the "vertical" MISFET. Like the example 1 (FIG. 1), the semiconductor device of this example has an IGBT and a diode, and is the IGBT with the built-in diode.

However, the gate electrode 5 of the IGBT has a "planar gate type" configuration. Specifically, as shown in FIG. 17 (A), the p-type channel region (the p-type semiconductor region) 2 serving as a channel region is arranged over a principal surface of the n⁻-type drift layer 1 serving as a drain region; the n-type source region (the n-type semiconductor region) 4 serving as a source region is arranged in the inside of this p-type channel region 2. In this case, the gate electrode 5 is arranged over the n⁻-type drift layer 1, the n-type source region 4, and the p-type channel region 2 through the gate insulating film 3.

The high-concentration n-type region 6 of which the diode is comprised is arranged on the back side of the substrate (the n⁻-type drift layer 1) and the high-concentration p-type region 7 is arranged in the inside of the high-concentration n-type region 6.

Moreover, the emitter electrode 8 is arranged on the surface side of the substrate (the n⁻-type drift layer 1) so as to be electrically coupled with the n-type source region 4; the collector electrode 9 is arranged on the surface side of the substrate so as to be electrically coupled with the high-concentration n-type region 6 and the high-concentration p-type region 7.

Here, the high-concentration n-type region 6 is higher in n-type impurity concentration than, for example, the n-type source region 4, and the high-concentration p-type region 7 is higher in p-type impurity concentration than, for example, the p-type channel region 2. The impurity concentrations thereof are more than or equal to $1 \times 10^{19}$ cm$^{-3}$ in the interface of the p-n junction part. Moreover, examination of the inventors has reveled that when the impurity concentration of the above-mentioned p-n junction part becomes high, for example, becoming more than or equal to $3 \times 10^{20}$ cm$^{-3}$, the ON voltage at the time of the IGBT conduction becomes high, as described above. Therefore, it is desirable that the impurity concentrations of the above-mentioned p-n junction part be not less than $1 \times 10^{19}$ cm$^{-3}$ and not more than $3 \times 10^{20}$ cm$^{-3}$. Moreover, as was explained in the example 1, etc., from the viewpoint of producing the conductivity modulation effectively, it is desirable that the thickness of the high-concentration n-type region 6 (n$^{++}$ layer) be set to less than or equal to 50 nm. Moreover, from the viewpoint of reduction of the turn-off loss, it is desirable that the thickness of the high-concentration p-type region 7 (p$^{++}$ layer) be set to less than or equal to 50 nm.

Thus, according to this example, since the IGBT and the diode were complexly incorporated in the same substrate, it is possible to create the effects explained in detail in the example 1 (for example, the above-mentioned effect 1 and effect 2) such as achieving multi-functionalization of the semiconductor device.

[Manufacturing Method Explanation]

Although there is no restriction about the manufacturing method of the semiconductor device of this example, for example, the p-type channel region 2, the n-type source region 4, the high-concentration n-type region 6, and the high-concentration p-type region 7 are formed over the substrate (the n⁻-type drift layer 1) using an ion implantation technology, subsequently the gate insulating film 3 is formed by thermal oxidation treatment, etc. over the substrate, and subsequently the gate electrode 5 is formed so as to cover the n⁻-type drift layer 1 to the n-type source region 4 through the p-type channel region 2 by depositing the polycrystalline silicon film in which an n-type impurity (for example, phosphor (P)) was doped and patterning it. Furthermore, after forming an insulating layer IL over the gate electrode 5, by depositing and patterning, for example, an aluminum (Al) film over the substrate as a conductive film, the emitter electrode 8 is formed over the n-type source region 4, and the collector electrode 9 comprised of a conductive film is formed on the back side of the high-concentration p-type region 7.

(B) Structure Explanation

FIG. 17 is a principal part sectional view showing a semiconductor device of this example, and FIG. 17 (B) shows a configuration of a "planar gate type" IGBT that is a "horizontal" MISFET. Like the example 1 (FIG. 1), the semiconductor device of this example has an IGBT and a diode, and is the IGBT with the built-in diode.

However, the IGBT has a "horizontal" configuration, and in which the high-concentration n-type region 6 and the high-concentration p-type region 7 of which the diode is comprised are also arranged in the horizontal direction. Specifically, as shown in FIG. 17, the p-type channel region (the p-type semiconductor region) 2 serving as a channel region is arranged over the principal surface of the n⁻-type drift layer 1 serving as a drain region; the n-type source region (n-type semiconductor region) 4 serving as a source region is arranged in the inside of this p-type channel region 2. In this case, the gate electrode 5 is arranged over the p-type channel region 2 located between the n⁻-type drift layer 1 and the n-type source region 4 through the gate insulating film 3.

The high-concentration n-type region 6 of which the diode is comprised is arranged on the surface side of the substrate (the n⁻-type drift layer 1); the high-concentration p-type region 7 of which the diode is comprised is arranged in the inside of the high-concentration n-type region 6.

Moreover, the emitter electrode 8 is arranged on the surface side of the substrate (the n⁻-type drift layer 1) so as to be electrically coupled with the n-type source region 4; the collector electrode 9 is arranged on the surface side of the substrate so as to contact the high-concentration n-type region 6 and the high-concentration p-type region 7.

Here, the high-concentration n-type region 6 is higher in n-type impurity concentration than, for example, the n-type source region 4, and the high-concentration p-type region 7 is higher in p-type impurity concentration than, for example, the p-type channel region 2. The impurity concentrations thereof are more than or equal to $1 \times 10^{19}$ cm$^{-3}$ in the interface of the p-n junction part. Moreover, examination of the inventors has revealed that when the impurity concentrations of the above-mentioned p-n junction part become high, for example, becoming higher than or equal to more $3 \times 10^{20}$ cm$^{-3}$, the ON voltage at the time of the IGBT conduction becomes high as described above. Therefore, it is desirable that the impurity concentrations of the above-mentioned p-n junction part be not less than $1 \times 10^{19}$ cm$^{-3}$ and not more than $3 \times 10^{20}$ cm$^{-3}$. Moreover, as was explained in the example 1, etc., from the viewpoint of producing the conductivity modulation efficiently, it is desirable that the thickness of the high-concentration n-type region 6 (n$^{++}$ layer) be set to less than or equal to 50 nm. Moreover, from the viewpoint of reduction of the turn-off loss, it is desirable that the thickness of the high-concentration p-type region 7 (p$^{++}$ layer) be set to less than or equal to 50 nm.

Thus, according to this example, since the IGBT and the diode are complexly incorporated into the same substrate, it is possible to attain the effects explained in detail in the example 1 (for example, the above-mentioned effect 1 and effect 2) such as achieving multi-functionalization of the semiconductor device.

Moreover, by adopting a "horizontal" configuration, installation, integration, etc. of a control circuit and a drive circuit become easy, and improvement in an additional function can be achieved. Moreover, by p-n separation, adoption of a dielectric isolation structure, and utilization of a silicon-on-insulator (SOI) substrate, countermeasures against latchup of a parasitic element become easy, and it can be applied to a functional power converter, etc.

[Manufacturing Method Explanation]

Although there is no restriction about the manufacturing method of the semiconductor device of this example, for example, the p-type channel region 2, the n-type source region 4, the high-concentration n-type region 6, and the high-concentration p-type region 7 are formed on the substrate (the n⁻-type drift layer 1) using the ion implantation technology, subsequently the gate insulating film 3 is formed by thermal oxidation treatment, etc. over the substrate, and then the gate electrode 5 is formed so as to cover the n⁻-type drift layer 1 to the n-type source region 4 through the p-type channel region 2 by depositing a polycrystalline silicon film in which an n-type impurity (for example, phosphor (P)) was doped and patterning it. Furthermore, the emitter electrode 8 is formed over the n-type source region 4 by depositing and patterning, for example, an aluminum (aluminum) film on the substrate as a conductive film, and the collector electrode 9 is formed by depositing and patterning a conductive film over the high-concentration n-type region 6 and the high-concentration p-type region 7.

Example 7

Figure 18:
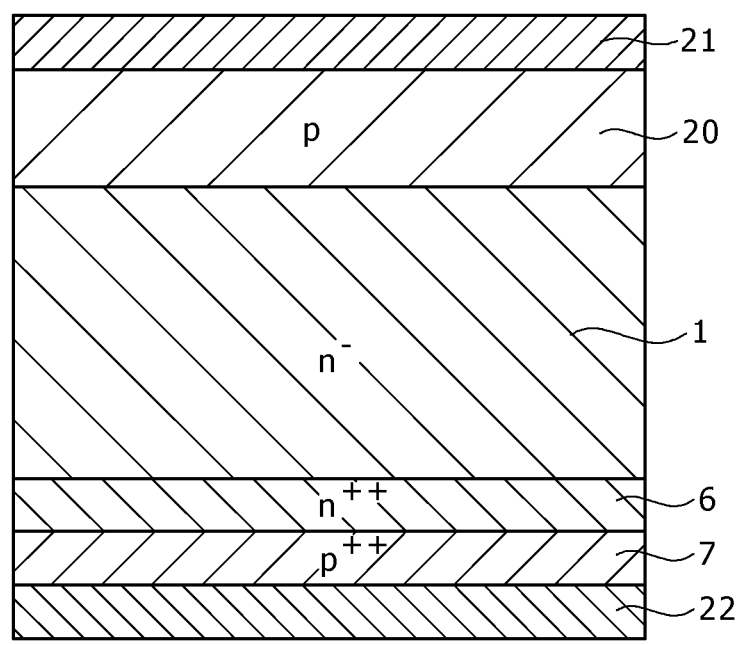
FIG. 18 is a principal part sectional view showing a semiconductor device of an example 7.

In the above-mentioned examples 1 to 6, although the high-concentration p-n junction part (6, 7) was applied to the IGBT with the built-in diode, the element to which the high-concentration p-n junction part (6, 7) is applied may be used as a mere diode element.
[Structure Explanation]
FIG. 18 is a principal part sectional view showing a semiconductor device (diode element) of this example. The semiconductor device (the diode element) of this example has a p-type anode region 20 that is arranged on the surface side of the substrate (the n⁻-type drift layer 1) and the high-concentration p-n junction part that is arranged on the back side of the substrate (the n⁻-type drift layer 1) and is comprised of the high-concentration n-type region 6 and the high-concentration p-type region 7. The high-concentration n-type region 6 is arranged on the back side of the n⁻-type drift layer 1, and the high-concentration p-type region 7 is arranged over this high-concentration n-type region 6.

Moreover, an anode electrode 21 electrically coupled with the p-type cathode region (the p-type semiconductor region) 20 is arranged on the surface side of the substrate (the n⁻-type drift layer 1); a cathode electrode 22 is arranged over the high-concentration p-type region 7 on the back side of the substrate (the n⁻-type drift layer 1).

The semiconductor device (diode element) of this example is of a configuration that corresponds to a cross section obtained by cutting out a central part of the emitter electrode 8 of FIG. 1 in a longitudinal direction. That is, the semiconductor device can be associated with one such that the emitter electrode 8 is replaced with the anode electrode 21, the collector electrode 9 is replaced with the cathode electrode 22, and the p-type channel region 2 is replaced with the p-type anode region 20 in the above-mentioned cross section.

Here, the high-concentration n-type region 6 is higher in n-type impurity concentration than, for example, the n⁻-type drift layer 1, and the high-concentration p-type region 7 is higher in p-type impurity concentration than, for example, the p-type anode region 20. The junction of these high-concentration n-type region 6 and high-concentration p-type region 7 is a tunnel junction as will be described later, and the impurity concentrations thereof are more than or equal to $1 \times 10^{19}$ cm⁻³ in the interface of the p-n junction part.

Thus, in the case where the high-concentration p-n junction is incorporated in a diode element, a recovery characteristic of the diode element improves.

When recovery of the diode element is hard, namely, when rates of change of the current and the voltage become steep, there arises a problem that the EMI noise increases.

Figure 19:
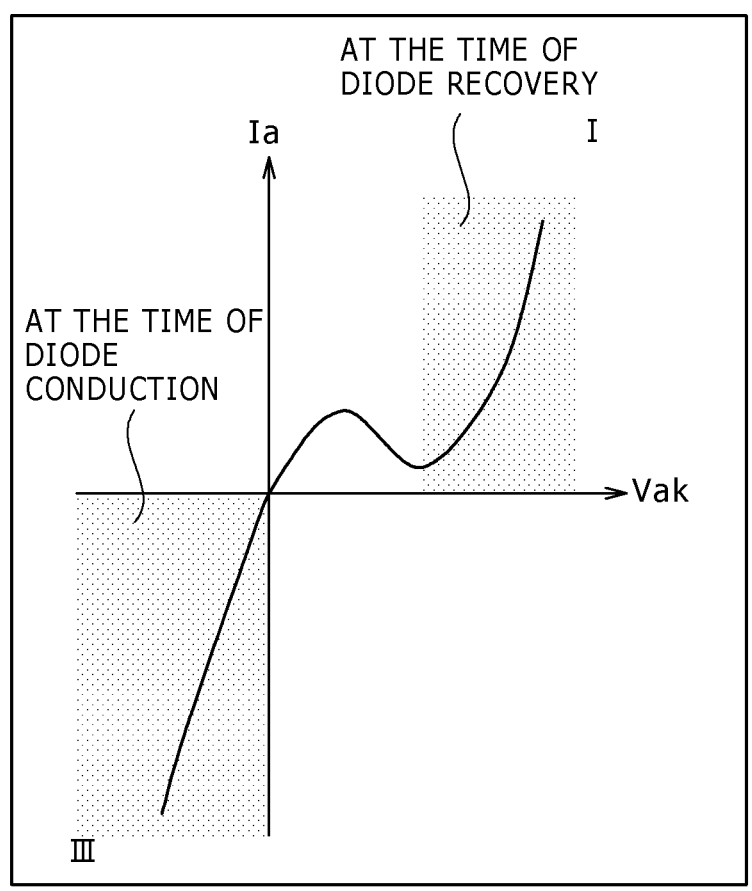
FIG. 19 is a diagram showing an output characteristic of the high-concentration p-n junction part.

FIG. 19 shows an output characteristic of the high-concentration p-n junction part. As explained in the example 1 referring to FIG. 2, in the high-concentration p-n junction comprised of the high-concentration n-type region 6 and the high-concentration p-type region 7, when a positive voltage is applied between the anode (the high-concentration p-type region 7) and the cathode (the high-concentration n-type region 6), after a current rises from 0 V (zero volts), with increasing voltage, the characteristic passes a region where the current decreases (negative resistance), and the current increases again (the first quadrant I). On the other hand, when a negative voltage is applied, a current flows in the reverse direction (the third quadrant III).

In this example, when the high-concentration p-n junction part becomes conductive, a current flows from zero volts by a tunnel current using a characteristic shown in the halftone dot meshing portion of the third quadrant III. On the other hand, when recovering the diode element, holes are injected from the high-concentration p-type region 7 into the n⁻-type drift layer 1 through the high-concentration n-type region 6 by diffusion using a characteristic shown in the halftone dot meshing portion of the first quadrant I. By the holes being injected thereinto, waveforms of the current and the voltage of the recovery become soft. That is, the rates of change of the current and the voltage become mild, and the EMI noise decreases.

Also in this case, in order to produce the tunnel phenomenon effectively, it is desirable that the impurity concentrations of the p-n junction part interface of the high-concentration n-type region 6 and the high-concentration p-type region 7 be more than or equal to $1 \times 10^{19}$ cm⁻³. Moreover, examination of the upper limits of the impurity concentrations by the inventors has given a finding that when the impurity concentrations are too high, the EMI noise increases at the time of the recovery.

A reason why this EMI noise increases is that holes are not diffusion injected from the high-concentration p-type region 7 (p⁺⁺ layer) into the high-concentration n-type region 6 (n⁺⁺ layer), and electrons flow from the high-concentration n-type region 6 (n⁺⁺ layer) into the high-concentration p-type region 7 (p⁺⁺ layer) by the tunnel phenomenon. Therefore, by setting impurity concentrations of the high-concentration n-type region 6 (n⁺⁺ layer) and the high-concentration p-type region 7 (p⁺⁺ layer) to not less than $1 \times 10^{19}$ cm⁻³ and not more than $3 \times 10^{20}$ cm⁻³, it is possible to reduce the EMI noise and to suppress increase of the forward voltage drop of the diode.

Furthermore, examination of a configuration of the high-concentration p-n junction by the inventors has found that there is more suitable ranges about thicknesses of the high-concentration n-type region 6 (n⁺⁺ layer) and the high-concentration p-type region 7 (p⁺⁺ layer).

Regarding the thickness of the high-concentration n-type region 6 (n⁺⁺ layer), in the case where it is too thick, the holes injected from the high-concentration p-type region 7 (p⁺⁺ layer) recombine with electrons in the high-concentration n-type region 6 (n⁺⁺ layer) when the recovery causes conduction, and therefore injection of the holes into the n⁻-type drift layer 1 is suppressed, which makes small a lowering effect of the EMI noise. From the viewpoint of a depression effect of this EMI noise, it is desirable that the thickness of the high-concentration n-type region 6 (n⁺⁺ layer) be less than or equal to 50 nm.

Moreover, regarding the thickness of the high-concentration p-type region 7 (p⁺⁺ layer), in the case where it is too thick, the holes injected from the high-concentration p-type region 7 (p⁺⁺ layer) increase, and therefore a recovery loss increases. From the viewpoint of reduction of this recovery loss, it is desirable that the thickness of the high-concentration p-type region 7 (p$^{++}$ layer) be less than or equal to 50 nm.
[Manufacturing Method Explanation]

There is no restriction about the manufacturing method of the semiconductor device of this example. For example, using the ion implantation technology, the p-type anode region 20 is formed on the surface of the substrate (the n$^-$-type drift layer 1) and the high-concentration n-type region 6 and the high-concentration p-type region 7 are formed on the back (cathode side) of the substrate (the n$^-$-type drift layer 1). After that, the anode electrode 21 and the cathode electrode 22 are formed by depositing a conductive film over the surface and the back of the substrate.

Example 8

In the example 7 (FIG. 18), although the p-type anode region 20 was configured to be a concentration layer of almost a single p-type impurity, this p-type anode region may be comprised of a p-type region 20A and a p$^-$-type region 23.
[Structure Explanation]

Figure 20:
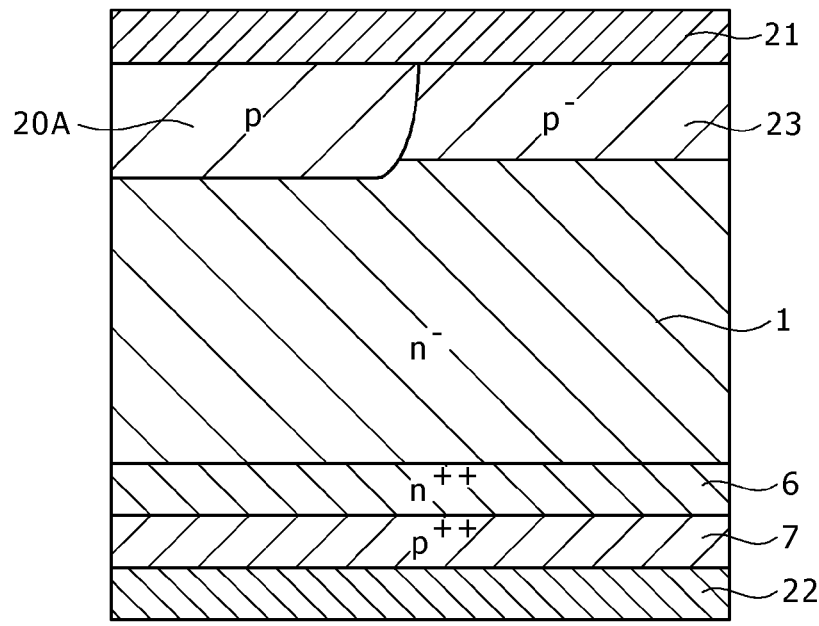
FIG. 20 is a principal part sectional view showing a semiconductor device of an example 8.

FIG. 20 is a showing a semiconductor device of this example. The semiconductor device (the diode element) of this example has the p-type region 20A and the p$^-$-type region 23 that are arranged on the surface side of the substrate (the n$^-$-type drift layer 1) and of which the p-type anode region is comprised, and the high-concentration p-n junction part that is arranged on the back side of the substrate (the n$^-$-type drift layer 1) and is comprised of the high-concentration n-type region 6 and the high-concentration p-type region 7. The high-concentration n-type region 6 is arranged on the back side of the n$^-$-type drift layer 1, and the high-concentration p-type region 7 is arranged on a back side of this high-concentration n-type region 6.

Moreover, the anode electrode 21 electrically coupled with the p-type cathode region (the p-type semiconductor region) 20 is arranged on the surface side of the substrate (the n$^-$-type drift layer 1); the cathode electrode 22 is arranged on the back side of the high-concentration p-type region 7 that is on the back side of the substrate (the n$^-$-type drift layer 1).

A difference from the example 7 (FIG. 19) is a point that the p-type anode region has the p-type region 20A and the p$^-$-type region 23 that is lower in p-type impurity concentration than this p-type region 20A.

Thus, by providing the p$^-$-type region 23, the recovery can be further softened as compared with the case of the example 7. Especially, by optimizing an area ratio of the p-type region 20A and the p$^-$-type region 23, the recovery can be further softened.

Thus, according to this example, in addition to the effects explained in the example 7, it is possible to achieve further improvement in the recovery characteristic.
[Manufacturing Method Explanation]

Although there is no restriction about the manufacturing method of the semiconductor device of this example, the p-type region 20A and the p$^-$-type region 23 are formed on the surface of the substrate (the n$^-$-type drift layer 1), for example, using an ion implantation technology, and the high-concentration n-type region 6 and the high-concentration p-type region 7 are formed on the back of the substrate (the n$^-$-type drift layer 1). Then, the anode electrode 21 and the cathode electrode 22 are formed by depositing conductive films over the surface and the back of the substrate.

Example 9

Although there is no restriction to application places of the semiconductor devices (the IGBTs with the built-in diodes) explained in the above-mentioned examples 1 to 6, they can be used, for example, for a drive circuit (an inverter circuit, a power converter) of a three-phase motor used for a hybrid vehicle, etc. FIG. 21 is a diagram showing a circuit diagram of the three-phase motor in this example. 601a to 603a and 601b to 603b are the flywheel diodes, 701a to 703a and 701b to 703b are the IGBTs, 801a to 803a and 801b to 803b are gate circuits, 910 is a P terminal among power supply terminals, 901 is an N terminal among power supply terminals, 910, 911, and 912 are a U terminal, a V terminal, and a W terminal, respectively, 950 is the motor, and 960 is a power supply. In this three-phase motor, the motor 950 can be subjected to variable speed control by a so-called "inverter circuit."

Specifically, electrical energy from the power supply 960 is converted into an alternating current of a desired frequency using the IGBTs (701a to 703a and 701b to 703b), and the circuit performs variable speed control on the number of revolutions of the motor 950. The motor 950 is the three-phase motor, and has inputs of the U phase 910, the V phase 911, and the W phase 912.

For example, input electric power of the U phase 910 is supplied when the gate circuit 801a of the IGBT 701a (the IGBT over the upper arm) whose collector is coupled to a power supply terminal 900 on a positive side is turned ON. On the other hand, in order to stop the input power of the U phase 910, what is necessary is just to turn OFF the gate circuit 801a. By repeating this, electric power of a desired frequency can be supplied to the motor 950.

The flywheel diode 601b is coupled to the IGBT 701b in reverse parallel to the IGBT 701b. The flywheel diode 601b releases energy accumulated in the coil of the motor 950, for example, when the IGBT 701a turns OFF, by commutating a current flowing in the IGBT 701a to the flywheel diode 601b that is coupled, in reverse parallel, with the IGBT 701b (the IGBT over the lower arm) whose emitter is coupled to the power supply terminal 901 on a negative side.

When the IGBT 701a over the upper arm is turned ON again, the flywheel diode 601b over the lower arm becomes non-conductive state, and electric power is supplied to the motor 950 through the IGBT 701a over the upper arm. In this way, the flywheel diode 601b repeats non-conduction and conduction according to ON and OFF of the IGBT 701a. Similarly, the flywheel diode 601a repeats non-conduction and conduction according to ON and OFF of the IGBT 701b. Thus, in a switching element single unit such as the IGBT, since it does not have a function capable of making this reverse direction current flow, the reverse current can be flowed by coupling a diode to the switching element such as the IGBT in reverse parallel.

Therefore, the semiconductor devices (the IGBTs with the built-in diodes) explained in the examples 1 to 6 can be applied to a parallel circuit part that is comprised of the IGBT of a circuit of the above-mentioned three-phase motor and a flywheel diode coupled thereto in reverse parallel.

Thereby, the number of chips that are incorporated in the circuit of the three-phase motor can be reduced. That is, whereas when each IGBT and each flywheel diode are configured with a different chip, respectively, six chips are necessary, the number of chips can be three by using the semiconductor device (the IGBT with the built-in diode) explained in the examples 1 to 6. Therefore, miniaturization and cost reduction of the inverter circuit can be achieved. Furthermore, as described above, according to the semiconductor devices (the IGBTs with the built-in diodes) explained in the examples 1 to 6, it is possible to avoid the problems of the "snap back" and the "current concentration" and to improve circuit characteristics of the three-phase motor such as improving controllability of the motor because its device characteristics are excellent.

Incidentally, the semiconductor devices (diode elements) explained in the examples 7 and 8 may also be incorporated in a circuit of the above-mentioned three-phase motor as flywheel diodes. Also in this case, as described above, since the characteristics of the semiconductor device (the diode element) are improved such as reduction of the EMI noise, the characteristic of the circuit of the three-phase motor that incorporates it can be improved.

Incidentally, the circuit shown in FIG. 21 is only an example, for example, a circuit part in which parallel circuits in each of which the switching element and the diode are coupled in reverse parallel are combined in series can be widely applied to coupled inverter circuits whose number is equal to the phase number of an alternating output. Moreover, although the inverter circuit for converting a direct current into an alternating current was explained as an example here, it is clear that the circuit part can also be applied to a converter circuit for converting an alternating current into a direct current.

In the foregoing, although the invention made by the inventors was specifically explained based on its examples, it goes without saying that the present invention is not limited to the above-mentioned examples and can be modified variously within a range that does not deviate from its gist.

For example, various modifications are possible as follows: applying the n-type hole barrier layer 12 of the example 5 to the semiconductor device of the example 1 (FIG. 1); inverting the conductivity type of the IGBT and the diode reversely, etc.

INDUSTRIAL APPLICABILITY

The present invention can be broadly used for semiconductor devices and in industries using these.

LIST OF REFERENCE SIGNS 1 n-type drift layer
2 p-type channel region
3 Gate insulating film
4 n-type source region
5 Gate electrode
6 High-concentration n-type region
7 High-concentration p-type region
8 Emitter electrode
9 Collector electrode
10 p-type well
11 n-type buffer layer
12 n-type hole barrier layer
20 p-type anode region
20A p-type region
21 Anode electrode
22 Cathode electrode
23 p⁻-type region
601a to 603a Flywheel Diode
601b to 603b Flywheel Diode
701A to 703A IGBT
701B to 703B IGBT
801a to 803a Gate circuit
801b to 803b Gate circuit
900 Power supply terminal (P terminal)
901 Power supply terminal (N terminal)
910 U phase (U terminal)
911 V Phase (V Terminal)
912 W Phase (W Terminal)
950 Motor
960 Power supply
B n-type buffer layer
C p-type collector layer
D n-type layer
I First quadrant
III Third quadrant
IL Insulating layer
Ic Collector current
T Trench
Vce Collector voltage

The invention claimed is:

1. A semiconductor device, comprising:
a semiconductor layer of a first conductivity type;
a first semiconductor region that is arranged in contact with the semiconductor layer on a first face side of the semiconductor layer and has a second conductivity type that is a conductivity type reverse to the first conductivity type;
a gate electrode that is provided in a trench provided so as to penetrate the first semiconductor region and reach to the semiconductor layer through a gate insulating film;
a second semiconductor region of the first conductivity type provided so as to contact the trench on the first face side of the first semiconductor region;
a first high-concentration semiconductor region of the first conductivity type that is arranged in contact with a second face side that is a side reverse to the first face side of the semiconductor layer; and
a second high-concentration semiconductor region of the second conductivity type that is arranged in contact with the second face side of the first high-concentration semiconductor region,
wherein a junction of the first high-concentration semiconductor region and the second high-concentration semiconductor region is a tunnel junction; and
wherein impurity concentrations in the junction part of the first high-concentration semiconductor region and the second high-concentration semiconductor region are more than or equal to $1\times10^{19}$ cm$^{-3}$ and less than or equal to $3\times10^{20}$ cm$^{-3}$.

2. The semiconductor device according to claim 1, comprising:
a first electrode that is arranged on the first face side of the semiconductor layer and is electrically coupled with the second semiconductor region; and
a second electrode that is arranged on the second face side of the semiconductor layer and is arranged so as to contact the second high-concentration semiconductor region.

3. The semiconductor device according to claim 1,
wherein the thickness of the first high-concentration semiconductor region is less than or equal to 50 nm.

4. The semiconductor device according to claim 1,
wherein the thickness of the second high-concentration semiconductor region is less than or equal to 50 nm.

5. The semiconductor device according to claim 1, comprising:
a third semiconductor region of the first conductivity type that is higher in impurity concentration than the semiconductor layer between the semiconductor layer and the first high-concentration semiconductor region.

6. The semiconductor device according to claim 1, comprising:
a fourth semiconductor region of the first conductivity type that that is higher in impurity concentration than the semiconductor layer between the semiconductor layer and the first semiconductor region.

7. A semiconductor device, comprising:
a semiconductor layer of a first conductivity type;
a first semiconductor region that is arranged in contact with the semiconductor layer in a part on a first face side of the semiconductor layer and has a second conductivity type that is a conductivity type reverse to the first conductivity type;
a second semiconductor region of the first conductivity type that is provided in contact with the first semiconductor region in a part on the first face side of the first semiconductor region;
a gate electrode provided over the first semiconductor region through a gate insulating film;
a first high-concentration semiconductor region of the first conductivity type that contacts the semiconductor layer in a part on the first face side of the semiconductor layer and is arranged being separated from the first semiconductor region; and
a second high-concentration semiconductor region provided in contact with the first high-concentration semiconductor region in a part on the first face side of the first high-concentration semiconductor region,
wherein a junction of the first high-concentration semiconductor region and the second high-concentration semiconductor region is a tunnel junction; and
wherein impurity concentrations in the junction part of the first high-concentration semiconductor region and the second high-concentration semiconductor region are more than or equal to $1\times10^{19}$ cm$^{-3}$ and less than or equal to $3\times10^{20}$ cm$^{-3}$.

8. The semiconductor device according to claim 7, comprising:
a first electrode that is arranged on the first face side of the semiconductor layer and is electrically coupled with the second semiconductor region; and
a second electrode that is arranged on the first face side of the semiconductor layer and is arranged so as to contact the second high-concentration semiconductor region.

9. A semiconductor device, comprising:
a semiconductor layer of a first conductivity type;
a first semiconductor region that is arranged in contact with the semiconductor layer on a first face side of the semiconductor layer and has a second conductivity type that is a conductivity type reverse to the first conductivity type;
a first high-concentration semiconductor region of the first conductor type that is arranged in contact with a second face side that is a side reverse to the first face side of the semiconductor layer; and
a second high-concentration semiconductor region of the second conductivity type that is arranged in contact with the second face side of the first high-concentration semiconductor region,
wherein a junction of the high-concentration semiconductor region and the second high-concentration semiconductor region is a tunnel junction; and
wherein impurity concentrations in the junction part of the first high-concentration semiconductor region and the second high-concentration semiconductor region are more than or equal to $1\times10^{19}$ cm$^{-3}$ and less than or equal to $3\times10^{20}$ cm$^{-3}$.

10. The semiconductor device according to claim 9, comprising:
a first electrode that is arranged on the first face side of the semiconductor layer and is electrically coupled with the first semiconductor region; and
a second electrode that is arranged on the second face side of the semiconductor layer and is arranged so as to contact the second high-concentration semiconductor region.

11. The semiconductor device according to claim 9, wherein the thickness of the second high-concentration semiconductor region is less than or equal to 50 nm.

12. The semiconductor device according to claim 9, wherein the thickness of the first high-concentration semiconductor region is less than or equal to 50 nm.

13. A power converter that has parallel circuits in each of which the IGBT and the diode are coupled in parallel with their forward directions arranged in reverse directions, the power converter comprising:
the semiconductor devices according to claim 1 as the IGBT and the diode.

14. A power converter that has parallel circuits in each of which the IGBT and the diode are coupled in parallel with their forward directions arranged in reverse directions, the power converter comprising:
the semiconductor device according to claim 9 as the diode.

* * * * *